(12) United States Patent
Voinigescu et al.

(10) Patent No.: US 12,211,928 B2
(45) Date of Patent: Jan. 28, 2025

(54) MONOLITHIC QUBIT INTEGRATED CIRCUITS

(71) Applicant: THE GOVERNING COUNCIL OF THE UNIVERSITY OF TORONTO, Toronto (CA)

(72) Inventors: Sorin Petre Voinigescu, Toronto (CA); Utku Alakusu, Toronto (CA); Shai Bonen, Toronto (CA); Ming-Jia Mecca Gong, Ottawa (CA); Lucy Wu, Dollard-des-Ormeaux (CA)

(*) Notice: Subject to any disclaimer, the term of this patent is extended or adjusted under 35 U.S.C. 154(b) by 0 days.

(21) Appl. No.: 17/497,099

(22) Filed: Oct. 8, 2021

(65) Prior Publication Data

US 2022/0223722 A1 Jul. 14, 2022

Related U.S. Application Data

(63) Continuation of application No. 16/704,719, filed on Dec. 5, 2019, now Pat. No. 11,171,225.

(60) Provisional application No. 62/775,477, filed on Dec. 5, 2018.

(51) Int. Cl.
*H01L 29/66* (2006.01)
*G06N 10/00* (2022.01)
*H01L 27/06* (2006.01)

(52) U.S. Cl.
CPC ....... *H01L 29/66984* (2013.01); *G06N 10/00* (2019.01); *H01L 27/0629* (2013.01); *H01L 29/66977* (2013.01)

(58) Field of Classification Search
CPC ......... H01L 29/66984; H01L 29/66977; H01L 27/0629; H01L 27/1203; H01L 21/823437
See application file for complete search history.

(56) References Cited

U.S. PATENT DOCUMENTS

| | | | |
|---|---|---|---|
| 10,378,967 B1* | 8/2019 | Vogelsang | .......... H01L 27/1203 |
| 2020/0227523 A1* | 7/2020 | Leipold | ............. H01L 29/66977 |
| 2022/0107345 A1* | 4/2022 | Nakagawa | ....... H03K 19/00315 |

* cited by examiner

*Primary Examiner* — Marc Anthony Armand
(74) *Attorney, Agent, or Firm* — Heer Law; Christopher D. Heer

(57) ABSTRACT

Described is a monolithic integrated circuit for use in quantum computing based on single and multiple coupled quantum dot electron- and hole-spin qubits monolithically integrated with the mm-wave spin manipulation and readout circuitry in commercial complementary metal-oxide-semiconductor (CMOS) technology. The integrated circuit includes a plurality of n-channel or p-channel metal-oxide-semiconductor field-effect transistor (MOSFET) cascodes each including a single-spin qubit or two coupled quantum dot qubits formed in an undoped semiconductor film adjacent at least one top gate. There is also a back gate formed in a silicon substrate adjacent a buried oxide layer or the at least one top gate, where the back gate controls the electron or hole entanglement and exchange interaction between the two coupled quantum dot qubits. The monolithic integrated circuits described may be used for monolithically integrated semiconductor quantum processors for quantum information processing.

7 Claims, 62 Drawing Sheets

| Parameter | 10x n-DQD with TIA | TIA only [7] | LNA [8] |
|---|---|---|---|
| Technology | 22nm FDSOI | 22nm FDSOI | 160nm Bulk |
| $S_{21}$ (dB) | 19 @ 300 K | 15/20 @ 300/2 K | 57 @ 4 K |
| BW (GHz) | 7.5 @ 300 K | 4/5 @ 300/2 K | 0.5 @ 4 K |
| $Z_{21,TIA}$ (dB$\Omega$) | 108/112 @ 300/12* K | 78/80 @ 300/2 K | N/A |
| $P_{DC}$ (mW) | 4.5 @ 300 K | 3.1 @ 300/2 K | 45.9 @ 4 K |

FIG. 35

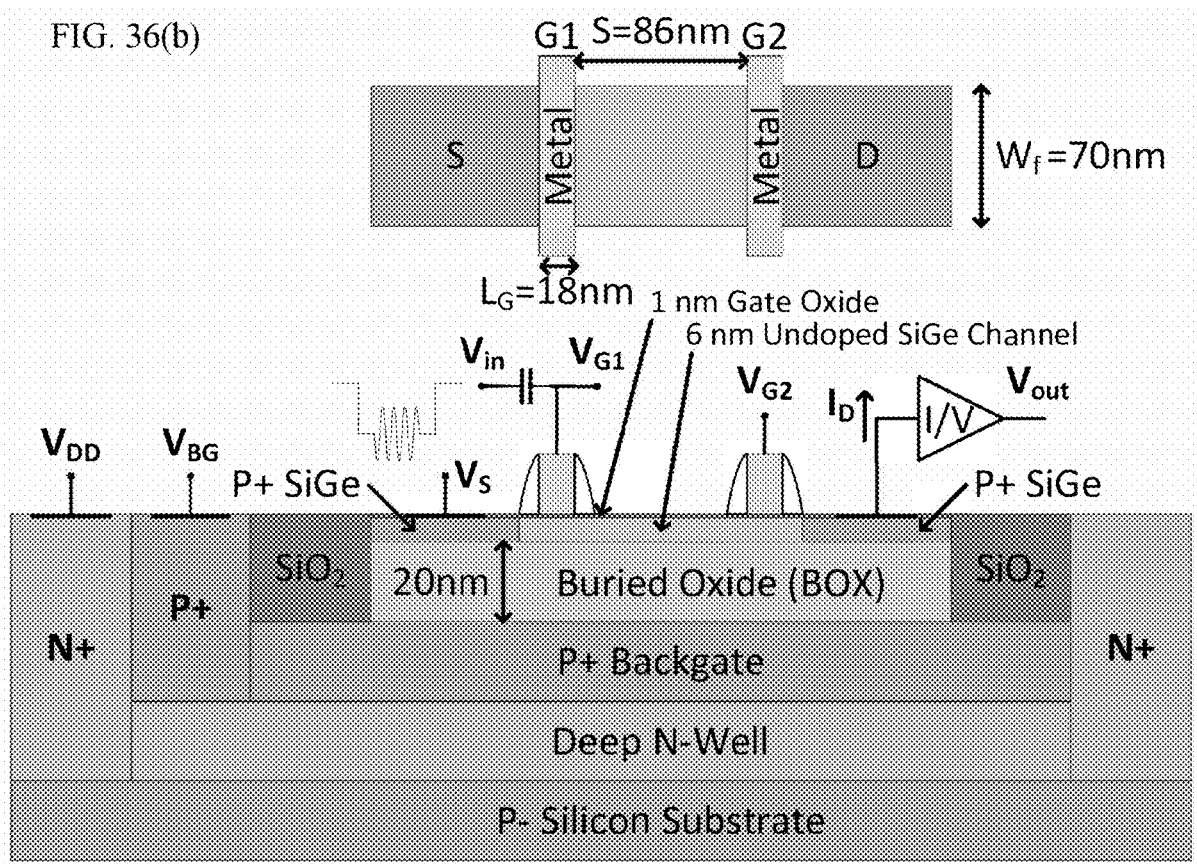

MONOLITHIC QUBIT INTEGRATED CIRCUITS

FIELD OF THE INVENTION

The present specification relates generally to integrated circuits (ICs) and more specifically to monolithically integrated semiconductor quantum processors.

BACKGROUND OF THE INVENTION

Silicon-based electron-spin and hole-spin coupled quantum-dot (QD) qubits have attracted substantial interest due to their potential for integration in commercial complementary metal-oxide-semiconductor (CMOS) technology. However, because of the low confinement and coupling energies (e.g., $\Delta E$, in the tens of $\mu eV$ range, comparable to the thermal noise level, $k_B T$, at 100 mK) their operation has been restricted to temperatures below 100 mK.

The current approach is for qubit array chips to be separately packaged and operated at a base temperature below 100 mK with their microwave control and readout electronics located on a separate die at 1-4 K and accessed via a large number of 50Ω coaxial cables. However, the lack of monolithic integration degrades readout fidelity and computing speed because the atto-Farad capacitance, high impedance qubit needs to drive 50Ω and 100× larger capacitance interconnect off-chip. Consequently, one of the biggest hurdles to realizing physical quantum computers has been the development of a reliable hardware platform capable of integrating billions of identical qubits monolithically.

Nonetheless, the multi-chip approach has historically been motivated by several factors, despite the interconnect and fidelity challenges which arise from it. More specifically, it has been a challenge to accommodate high yield, high $f_t/f_{MAX}$ transistors and microwave and analog-mixed-signal (AMS) circuits in the experimental laboratory technologies in which silicon qubits are manufactured. Additionally, state-of-the-art cryogenic cooling systems have also been limited in the dissipated power they can remove while maintaining a certain temperature, with some approaches showing a few mW at 100 mK and ~2 W at 4 K. More recently however, there has been mounting evidence that Si-based electron- and hole-spin qubits need not be limited to sub-1 K temperatures and that they are realizable in production CMOS technology, where they can be integrated with classical readout and control electronics.

As such, there is a need for qubits with higher confinement and coupling energies, with spin resonance in the upper mm-wave region, that permit higher temperature operation to alleviate these problems and enable large-scale monolithic quantum computing.

SUMMARY OF THE INVENTION

In an embodiment of the present invention, there is provided a monolithic qubit integrated circuit consisting of a qubit realized as the minimum size (Lmin, Wmin) undoped channel double-gate electron- or hole-channel metal-oxide-semiconductor field-effect transistor (MOSFET) in a fully depleted silicon on insulator (FDSOI) process driving a readout circuit consisting of a chain of scaled gain stages consisting of alternating transimpedance amplifiers and CMOS inverters.

In an embodiment of the present invention, a single spin qubit is realized with the minimum size ($L_{min}$, $W_{min}$) p-type MOSFET which features $Si_{1-x}Ge_x/Si_{1-y}Ge_y$ heterojunctions between the source and the channel and between the drain and the channel, whose role is to provide hole confinement in the undoped channel which acts as a 3D quantum dot.

In an embodiment of the present invention, a double spin qubit is realized with the minimum size ($L_{min}$, $W_{min}$) p-type MOSFET cascode (double gate MOSFET) which features $Si_{1-x}Ge_x/Si_{1-y}Ge_y$ heterojunctions between the source and the undoped channel and between the drain and the channel whose role is to provide hole confinement in the channel which acts as a coupled double quantum dot.

In an embodiment of the present invention, a multiple spin qubit is realized with the minimum size ($L_{min}$, $W_{min}$) p-type MOSFET cascode (double gate MOSFET) with two or more top gates and features $Si_{1-x}Ge_x/Si_{1-y}Ge_y$ heterojunctions between the source and the undoped channel and between the drain and the channel whose role is to provide hole confinement in the channel which acts as a coupled double quantum dot.

In an embodiment of the present invention, a multiple spin qubit is realized with the minimum size ($L_{min}$, $W_{min}$) p-type MOSFET cascode (double gate MOSFET) with two or more top gates and a selective back gate and features $Si_{1-x}Ge_x/Si_{1-y}Ge_y$ heterojunctions between the source and the undoped channel and between the drain and the channel whose role is to provide hole confinement in the channel which acts as a coupled double quantum dot.

In an embodiment of the present invention, the output stage is matched to 50Ω and is capable to drive off chip instruments or other circuits. A diode-connected MOSFET is connected to the supply (in electron-spin qubits) or to ground (in hole-spin qubits) at the output of the qubit to ensure current sinking. An appropriately sized capacitor is placed between the qubit and the readout amplifier to avoid DC current interaction.

In an embodiment of the present invention, the output stage is matched to 50Ω and is capable to drive off chip instruments or other circuits. The qubit is DC-coupled to the readout amplifier and there is no diode-connected MOSFET to the supply (in electron-spin qubits) or to ground (in hole-spin qubits) at the output of the qubit.

In an embodiment of the present invention, an ultra-low-power qubit IC allows for reading of Rabi oscillations in FDSOI technology.

In an embodiment of the present invention, the qubit IC may be scalable down to 2 nm and can operate above 1 K.

In an embodiment of the present invention, transimpedance amplifiers are optimized to read qubit currents in the range of 10 pA and 10 nA with ultra-low input capacitance to avoid overloading qubits and to maximize the spin-readout bandwidth.

According to an embodiment, there is provided a monolithic integrated circuit for use in quantum computing, the monolithic integrated circuit comprising: a plurality of n-channel or p-channel metal-oxide-semiconductor field-effect transistor (MOSFET) cascodes each including: at least one single-spin qubit or two coupled quantum dot qubits formed in an undoped semiconductor film; the undoped semiconductor film being adjacent at least one top gate wherein each qubit is near at least one of the at least one top gate; and a back gate formed in a silicon substrate adjacent a buried oxide layer or the at least one top gate, wherein the back gate controls the electron or hole entanglement and exchange interaction between the two coupled quantum dot qubits.

According to an embodiment, there is provided a monolithic integrated circuit for use in quantum computing, the monolithic integrated circuit comprising: a mm-wave spin manipulation circuit driving a plurality of p-channel or n-channel metal-oxide-semiconductor field-effect transistor (MOSFET) cascodes each including: at least two coupled quantum dot qubits; the at least two coupled quantum dot qubits formed in an undoped semiconductor film; the undoped semiconductor film being adjacent at least two top gates; and a back gate formed in a silicon substrate adjacent a buried oxide layer or the at least two top gates, wherein the back gate controls the electron or hole entanglement and exchange interaction between the two coupled quantum dot qubits; wherein each qubit or groups of qubits has individual readout amplifiers.

According to an embodiment, there is provided a minimum size single finger Lmin*Wmin FDSOI SiGe channel p-MOSFET as single-spin qubit with heterostructure barrier at the source/drain-to-channel interface.

According to an embodiment, there is provided a minimum size two finger 2*Lmin*Wmin FDSOI SiGe channel cascode as the two-spin qubit gate.

According to an embodiment, there is provided a FDSOI SiGe p-channel qubit with a selectively-placed back gate.

According to an embodiment, there is provided a FDSOI Si n-channel qubit with a selectively-placed back gate.

Other aspects and features according to the present application will become apparent to those ordinarily skilled in the art upon review of the following description of embodiments of the invention in conjunction with the accompanying figures.

BRIEF DESCRIPTION OF THE FIGURES

The principles of the invention may better be understood with reference to the accompanying figures provided by way of illustration of an exemplary embodiment, or embodiments, incorporating principles and aspects of the present invention, and in which:

FIG. 35 shows a table comparison of state-of-the-art qubit readout amplifiers;

FIGS. 36(a) to 36(c) show embodiments of a) p-MOSFET single-spin qubit, b) double-spin p-type cascode qubit, and c) triple-spin p-type cascode qubit;

DETAILED DESCRIPTION OF EMBODIMENTS OF THE INVENTION

Figure 1A:
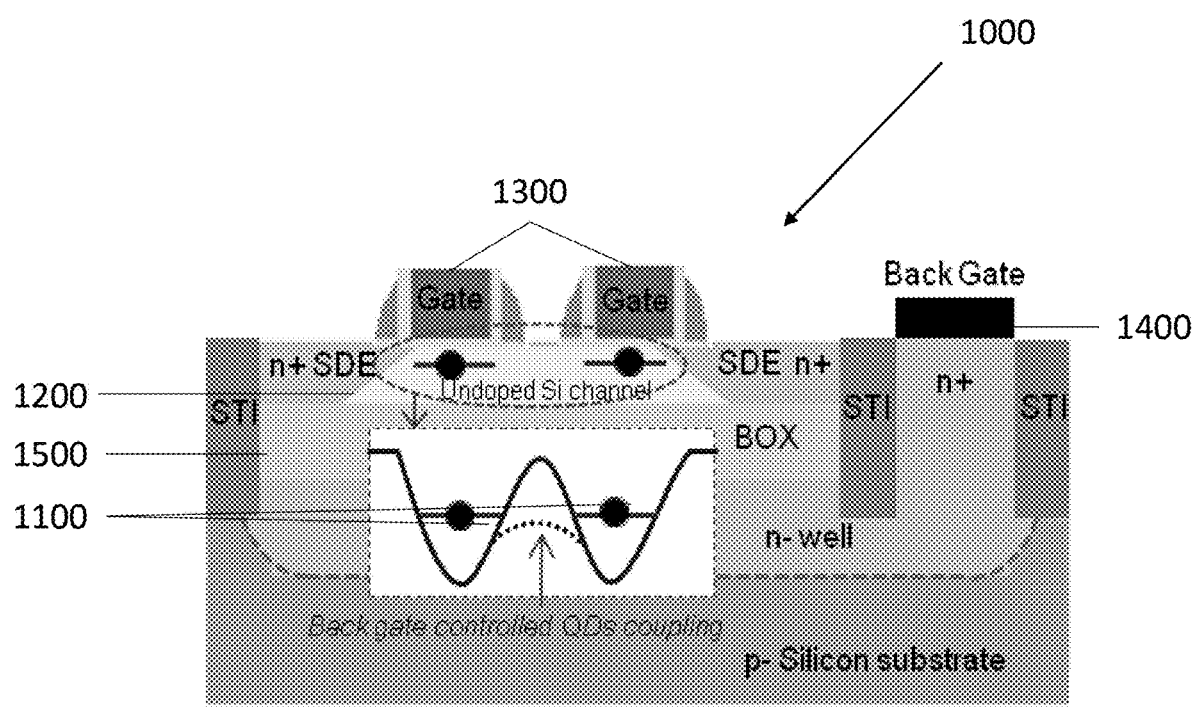
FIGS. 1(a) to 1(d) show an embodiment of an n-MOSFET cascode as two coupled quantum dot qubits along with its subbands, wave functions, and mode splitting energy.

The description that follows, and the embodiments described therein, are provided by way of illustration of an example, or examples, of particular embodiments of the principles of the present invention. These examples are provided for the purposes of explanation, and not of limitation, of those principles and of the invention. In the description, like parts are marked throughout the specification and the drawings with the same respective reference numerals. The drawings are not necessarily to scale and in some instances proportions may have been exaggerated in order to more clearly to depict certain features of the invention.

According to an embodiment, this description relates to monolithically integrated semiconductor quantum processors, such as per the characterizations in D1 (S. Bonen, et al. *Cryogenic Characterization of 22-nm FDSOI CMOS Technology for Quantum Computing ICs. In IEEE*, 2018) and the designs in D2 (M Gong, et al. *Design Considerations for Spin Readout Amplifiers in Monolithically Integrated Semiconductor Quantum Processors*), the entirety of which is hereby incorporated by reference. In particular, it relates to the design of a monolithic qubit integrated circuit consisting of a qubit realized as the minimum size (Lmin, Wmin) undoped channel double-gate n- or α-channel MOSFET in an FDSOI process driving a readout circuit consisting of a chain of appropriately scaled gain stages consisting of alternating transimpedance amplifiers and CMOS inverters.

According to an embodiment, the present description relates to an output stage that is matched to 50Ω and is capable to drive off chip instruments or other circuits. A diode-connected MOSFET may be connected to the supply (in electron-spin qubits) or to ground (in hole-spin qubits) at the output of the qubit to ensure sinking. A capacitor may be placed between the qubit and the readout amplifier to avoid DC current interaction. In a further embodiment, the diode is absent.

According to an embodiment, the present description relates to an ultra-lower-power (<5 mW) qubit IC for reading Rabi oscillations in the DC-to-60 GHz range in 22 nm and 12 nm FDSOI, that was fabricated and measured in 22 nm FDSOI technology and simulated in 12 nm FDSOI technology.

According to embodiments of the invention, the present description relates to a qubit concept and qubit IC that may be scalable in future CMOS nodes down to 2 nm (or smaller) where, according to quantum simulation, the qubit can operate at room temperature.

According to an embodiment, the present description relates to monolithic quantum computing integrated circuits operating above 1 Kelvin in 22 nm FDSOI CMOS, at about 4-5 K in 12 nm FDSOI CMOS, and at about 77 K in 5 nm CMOS technology.

FDSOI N- and P-Type Qubits

Figure 1B:
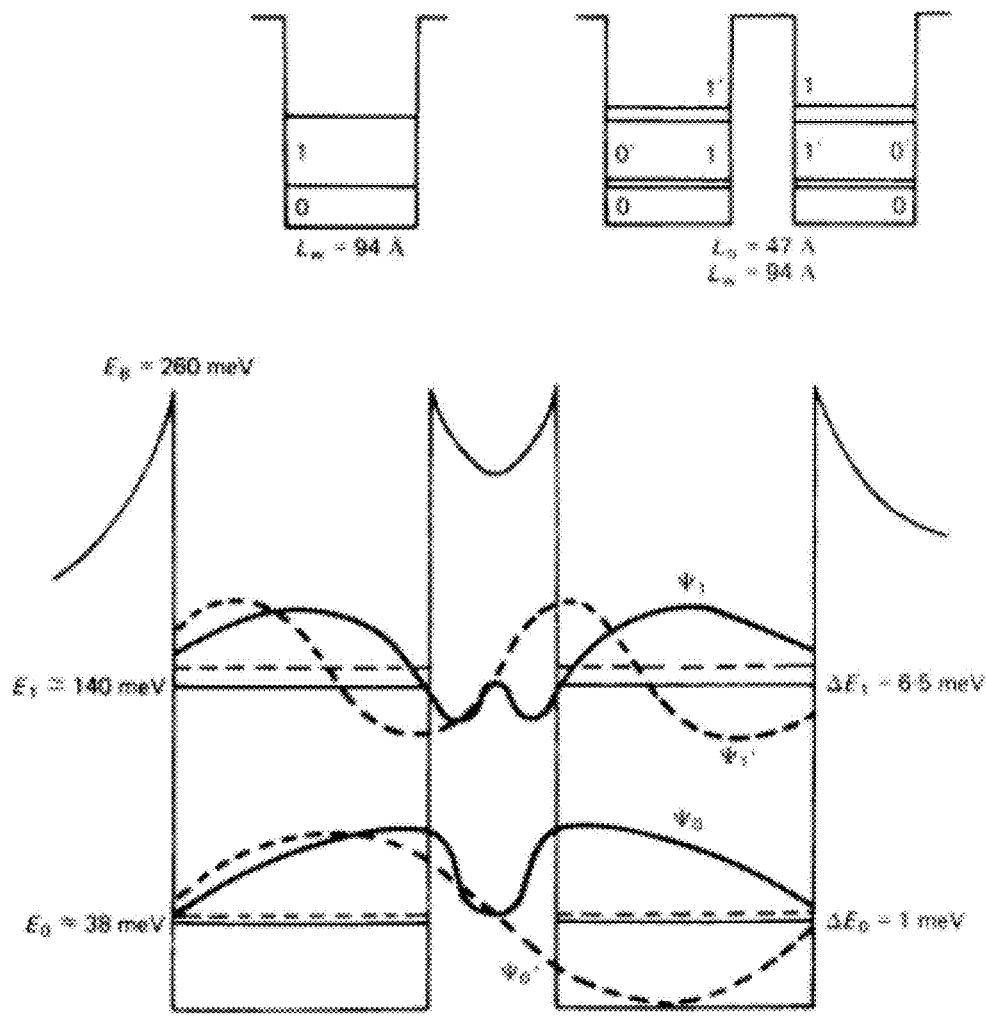

According to an embodiment as shown in FIG. 1(a), an n-MOSFET cascode 1000 may be designed as two coupled quantum dot qubits 1100. The qubits are realized using series-stacked Si n-MOSFET and SiGe p-MOSFET minimum size cascodes with multiple gates. QDs are formed in undoped semiconductor film 1200 below each top gate 1300, while the tunneling barrier and, therefore, electron or hole entanglement and exchange interaction between QDs, is controlled by the back gate 1400 formed in the Si substrate below the buried oxide (BOX) layer 1500 or by top gates 1300. According to an embodiment, the physical gate length (L) and width ($W_f$) may be within the range of about 12 to 20 nm and about 40 to 80 nm, respectively, while the gate pitch is within the range of about 50 to 100 nm. The subbands, wave functions, and mode splitting energy in a coupled quantum dot qubit are shown in FIG. 1(b).

Figure 36A:
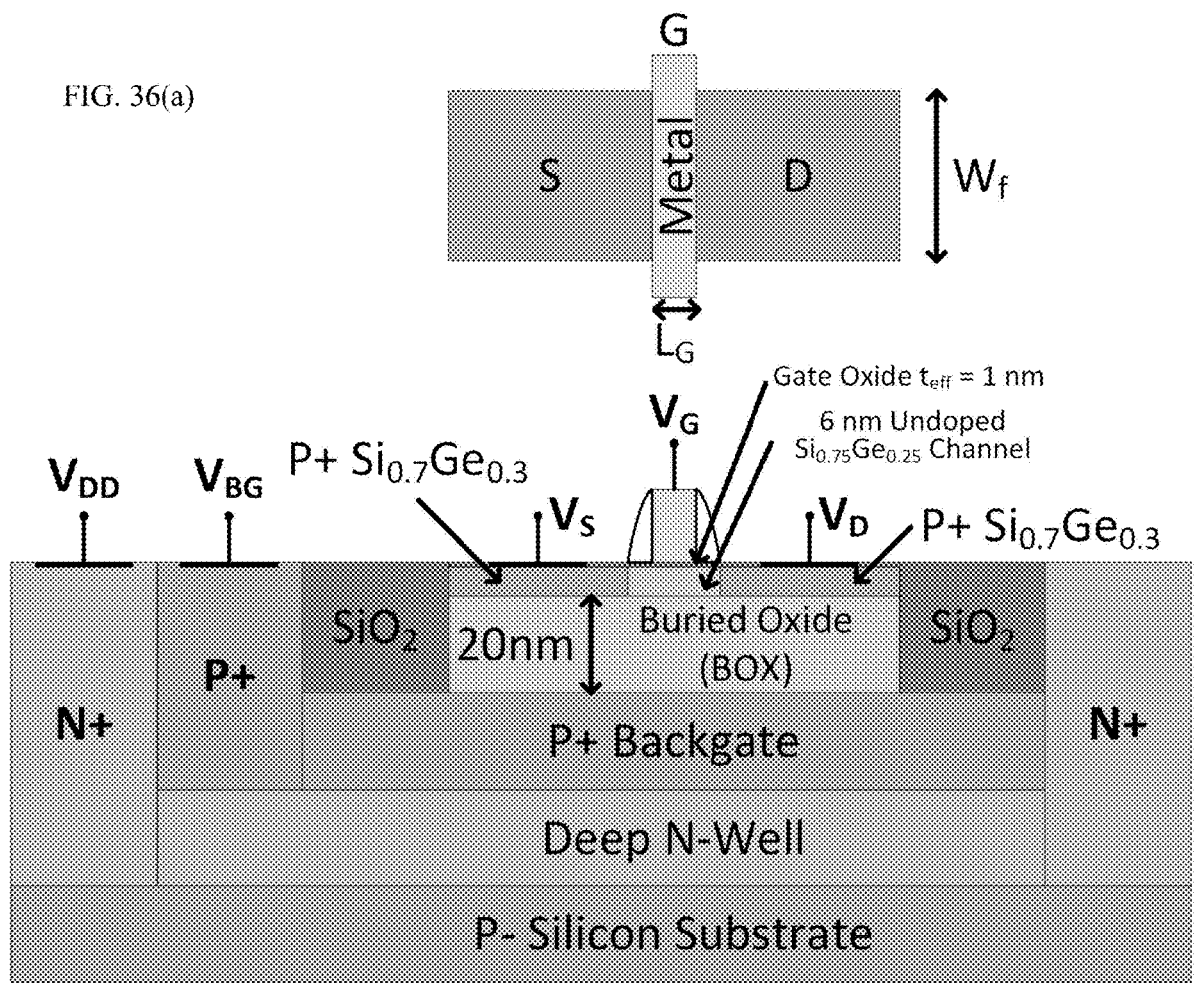
Figure 36C:
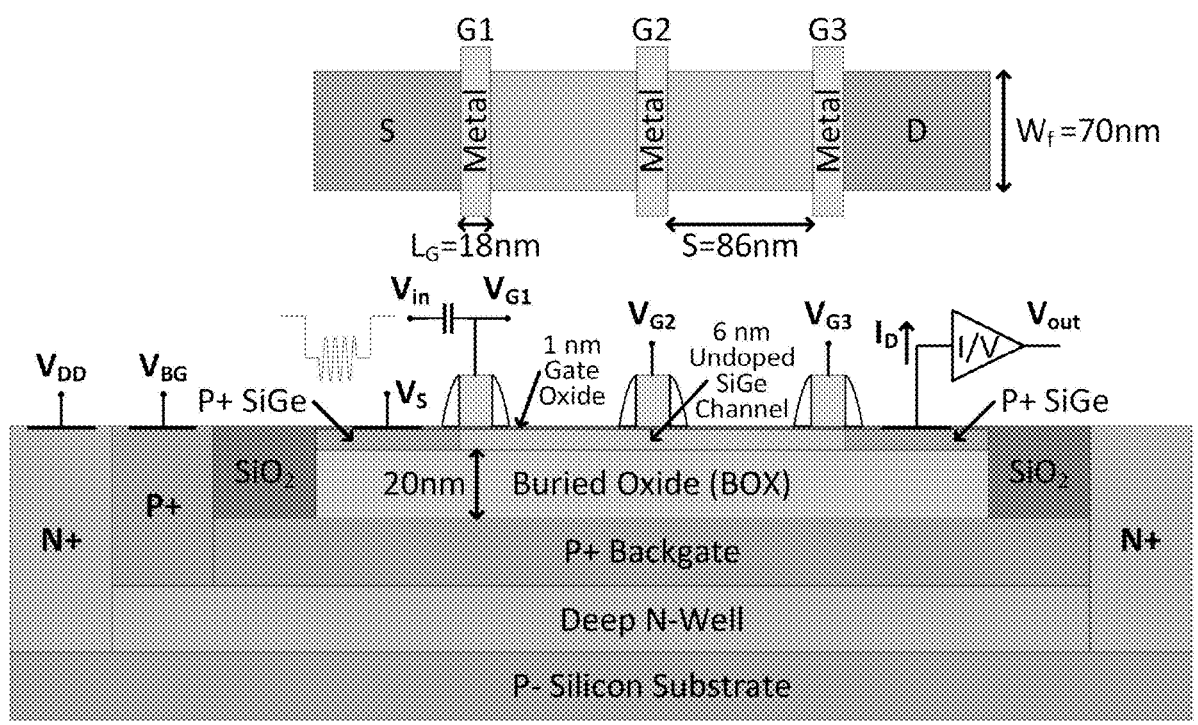

According to the embodiments as shown in FIGS. 36(a) to 36(c), a p-MOSFET cascode may be designed as two coupled quantum dot qubits as shown for example in FIG. 36(b). The qubits are realized using series-stacked SiGe p-MOSFET cascades minimum size cascodes with multiple gates. QDs are formed in undoped SiGe semiconductor film below each top gate, while the tunneling barrier and, therefore, hole entanglement and exchange interaction between QDs, is controlled by the back gate formed in the Si substrate below the buried oxide (BOX) layer or by top gates. $Si_{1-x}Ge_x/Si_{1-y}Ge_y$ heterojunctions are formed between the source and the channel and between the drain and the channel where y>x are the Ge mol fractions and both y and x are between 0 and 1. According to an embodiment, the physical gate length (L) and width ($W_f$) may be within the range of about 12 to 20 nm and about 40 to 80 nm, respectively, while the gate pitch is within the range of about 50 to 100 nm. The subbands, wave functions, and mode splitting energy in a coupled quantum dot qubit are shown in FIG. 1(b).

The n-MOSFET and the p-MOSFET qubits are fabricated as standard transistors and cascodes in a commercial FDSOI CMOS process with several mask waivers as described in the following paragraphs.

Figure 1C:
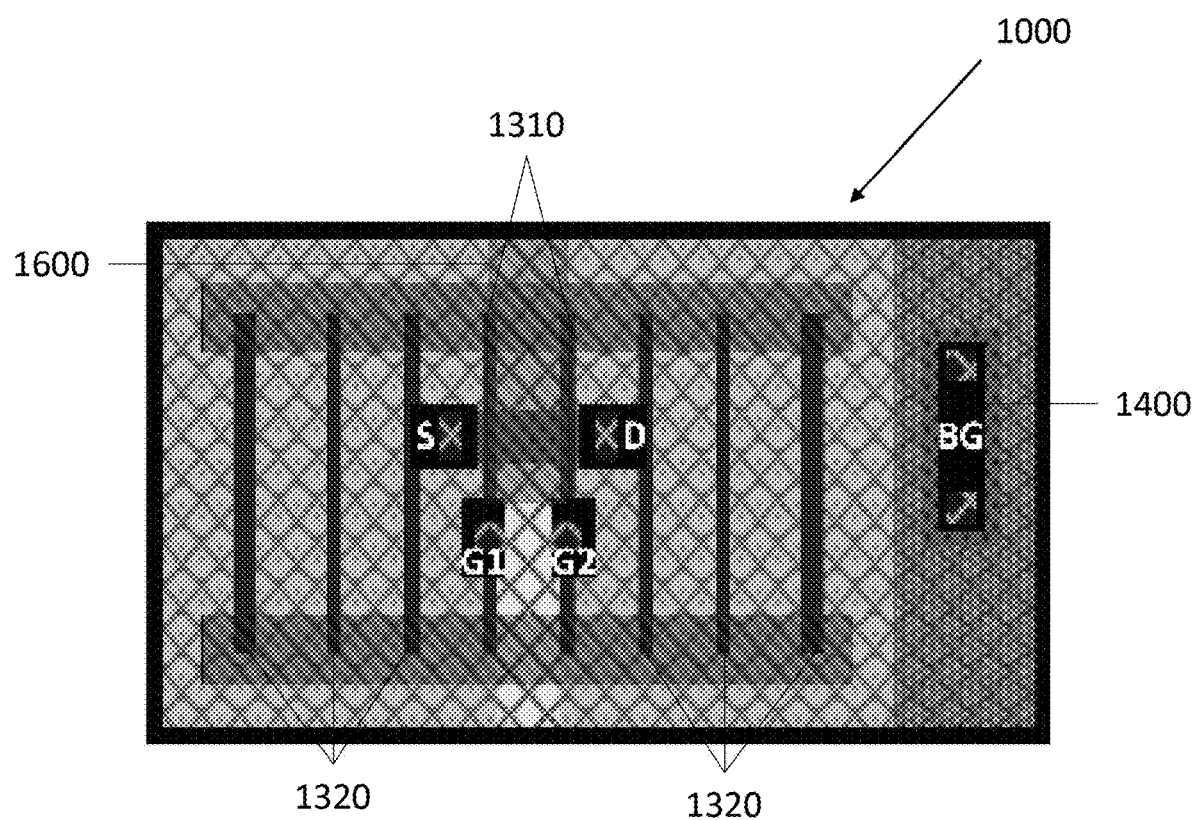
Figure 1D:
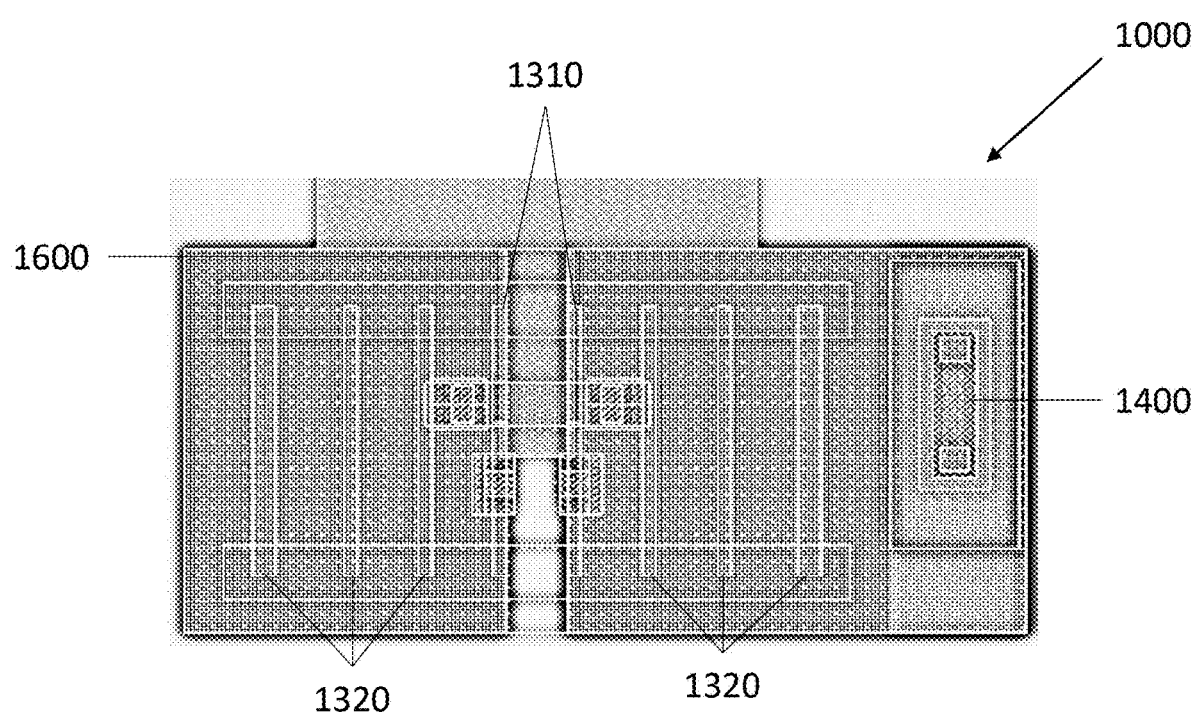

In FIG. 1(c) and FIG. 1(d), a top-level layout view of an embodiment of a fabricated n-qubit is provided with two active gates 1310 and three dummy gates 1320 on each side of the qubit. According to an embodiment, a blocking mask 1600 is placed between the two gates of the coupled double-QD (DQD) qubit to prevent ion implantation and contact formation in the undoped channel.

Figure 2A:
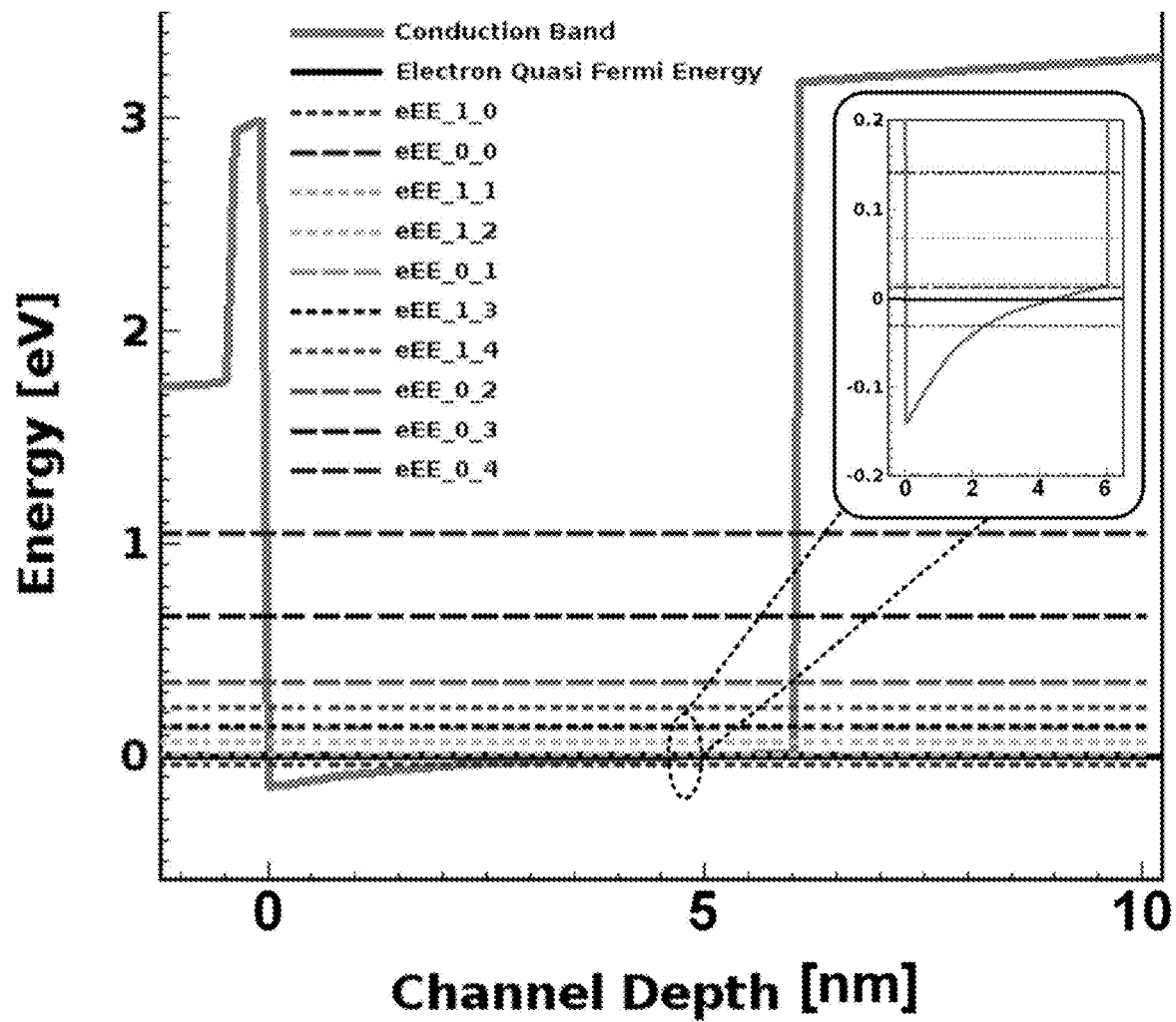
FIGS. 2(a) to 2(b) show the simulated n-MOSFET conduction band profile of an embodiment.
Figure 2B:
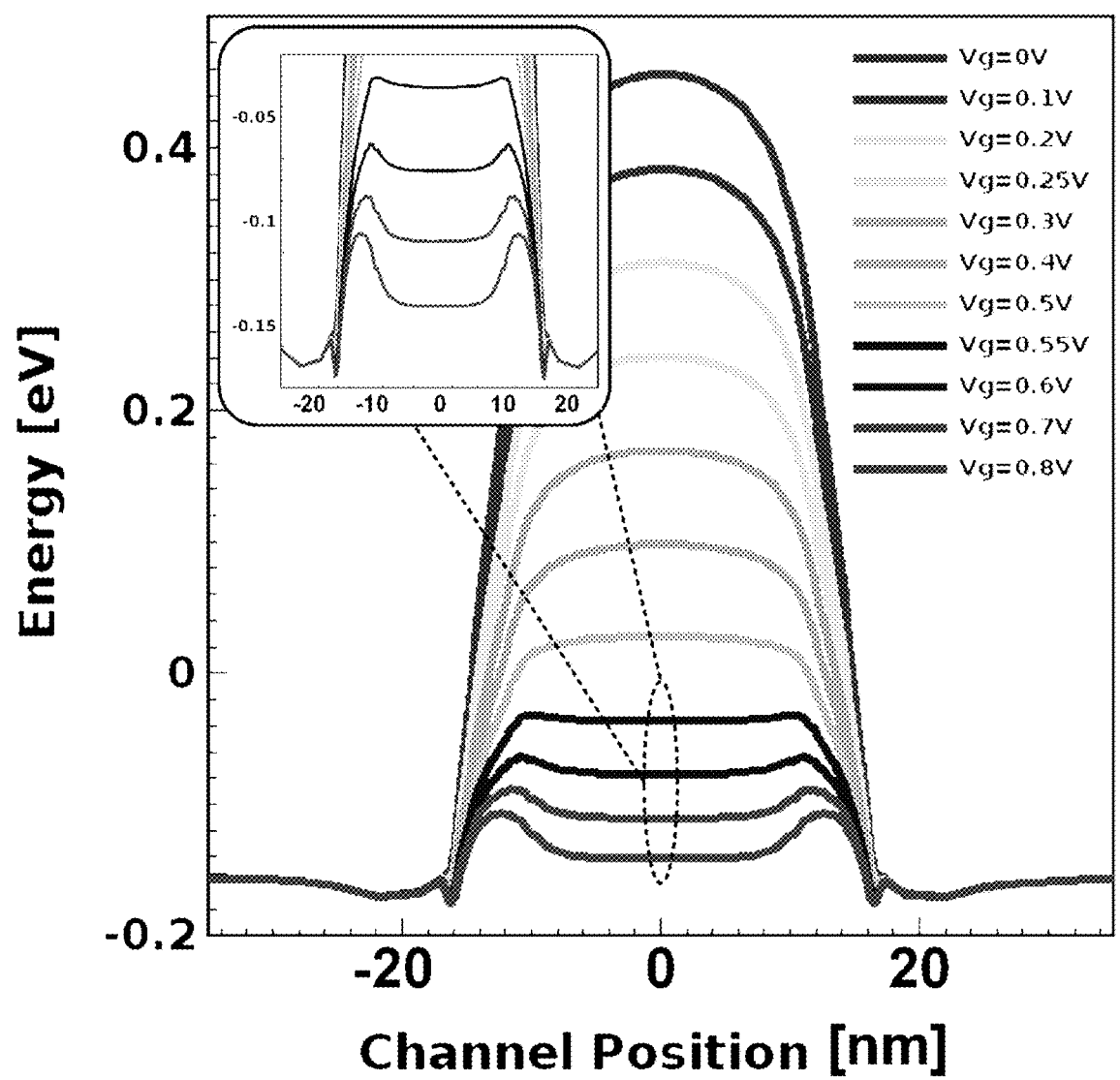

FIG. 2(a) shows the TCAD-simulated conduction band profiles and energy levels along the z-direction (eigen-energy levels also shown), perpendicular to the gate-channel interface. The conduction band profile along the n-MOSFET channel (x-direction) is reproduced in FIG. 2(b) at 77 K for various $V_{GS}$ values and $V_{DS}$ of 1 mV. In these embodiments, it appears that the gate-source and gate-drain spacers are sufficient to form 10 meV parabolic potential barriers which confine the carriers between the source and drain in the x-direction. Confinement along the y- and z-directions is provided by the gate oxide, buried oxide (BOX), and shallow trench isolation (STI), which act as infinite potential barriers.

Figure 3A:
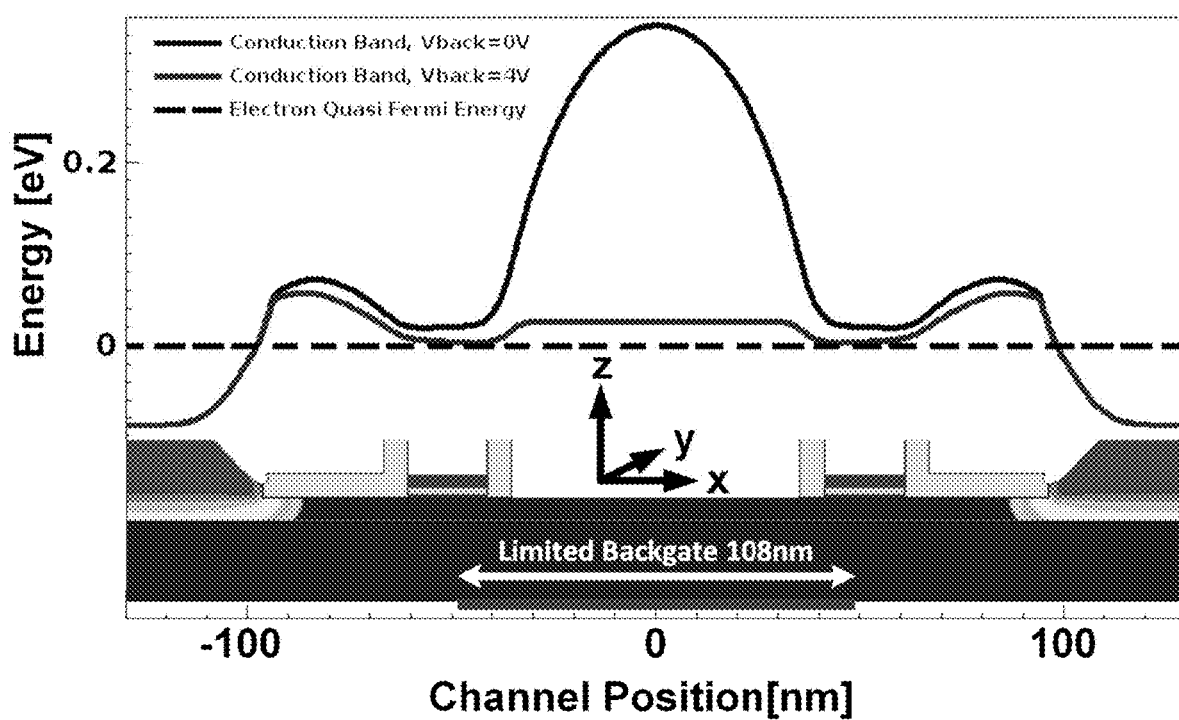
FIGS. 3(a) to 3(b) show coupled-QD simulations of an embodiment.
Figure 3B:
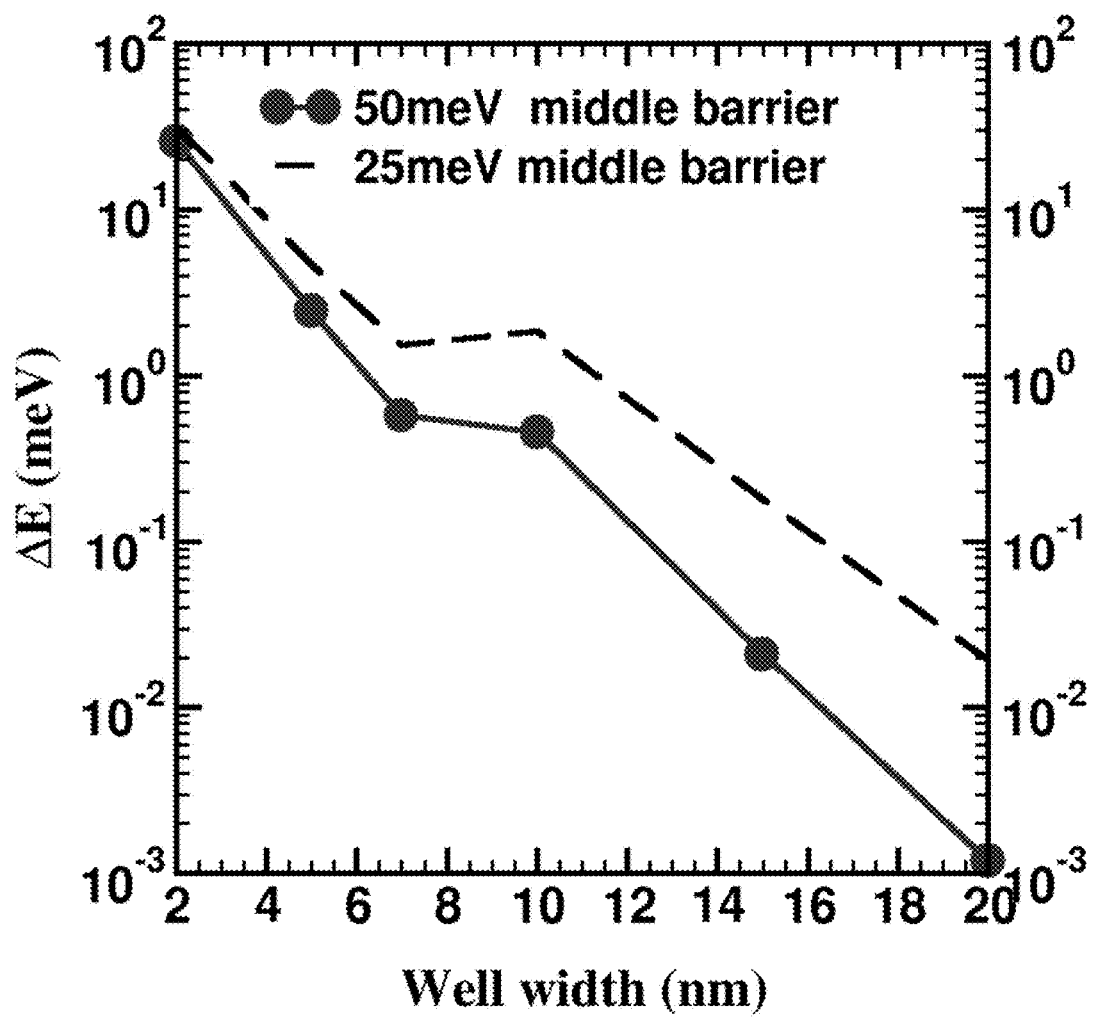

FIG. 3(a) shows the conduction band and Fermi-level profiles in a DQD qubit embodiment at 300 K, illustrating how the height of the potential barrier between the two QDs could be controlled by a n-well or p-well placed selectively only below the barrier region. Simulations of coupled QD scaling in other embodiments are shown in FIG. 3(b), indicating that ΔE>30 meV will be possible at 2 nm minimum feature size. This supports the feasibility of room temperature operation in some embodiments.

Figure 4:
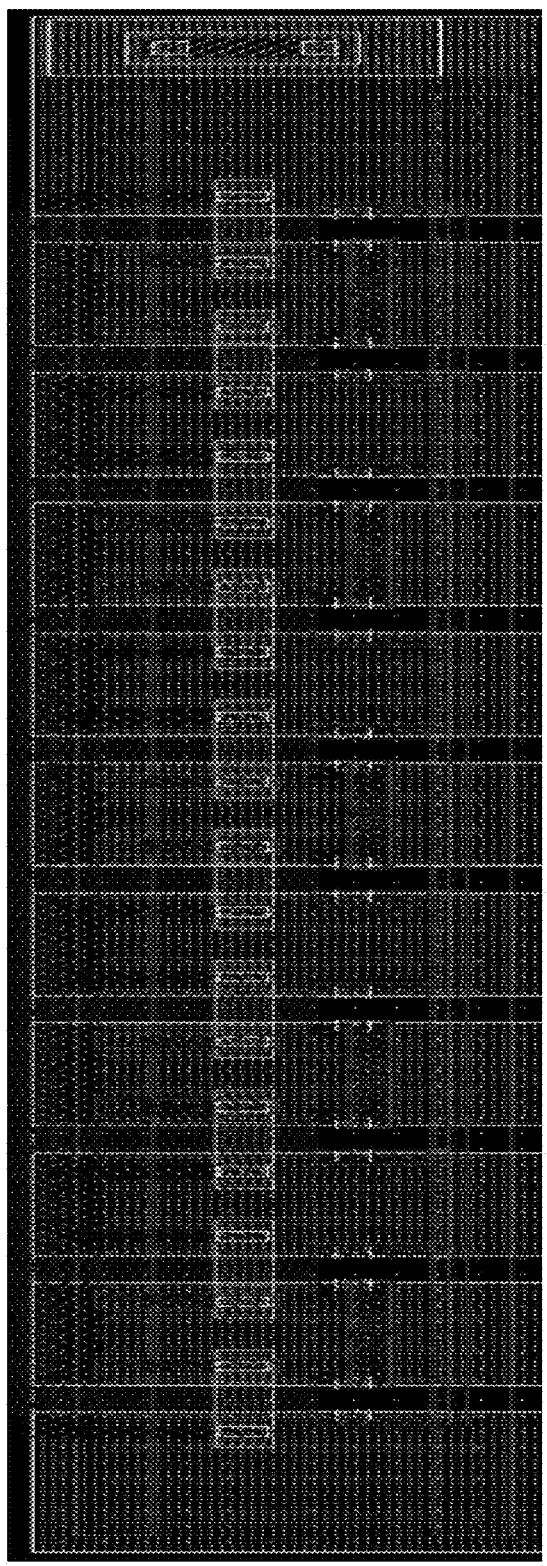
FIG. 4 shows a schematic diagram of an embodiment of a DQD qubit.

According to an embodiment, qubit strain uniformity and matching may be improved and quantum gate fidelity can be increased by connecting multiple qubits in parallel in the form of a multi-finger, minimum-size n- or p-type cascode layout. One such embodiment is shown in FIG. 4.

Cryogenic Measurements

Figure 5:
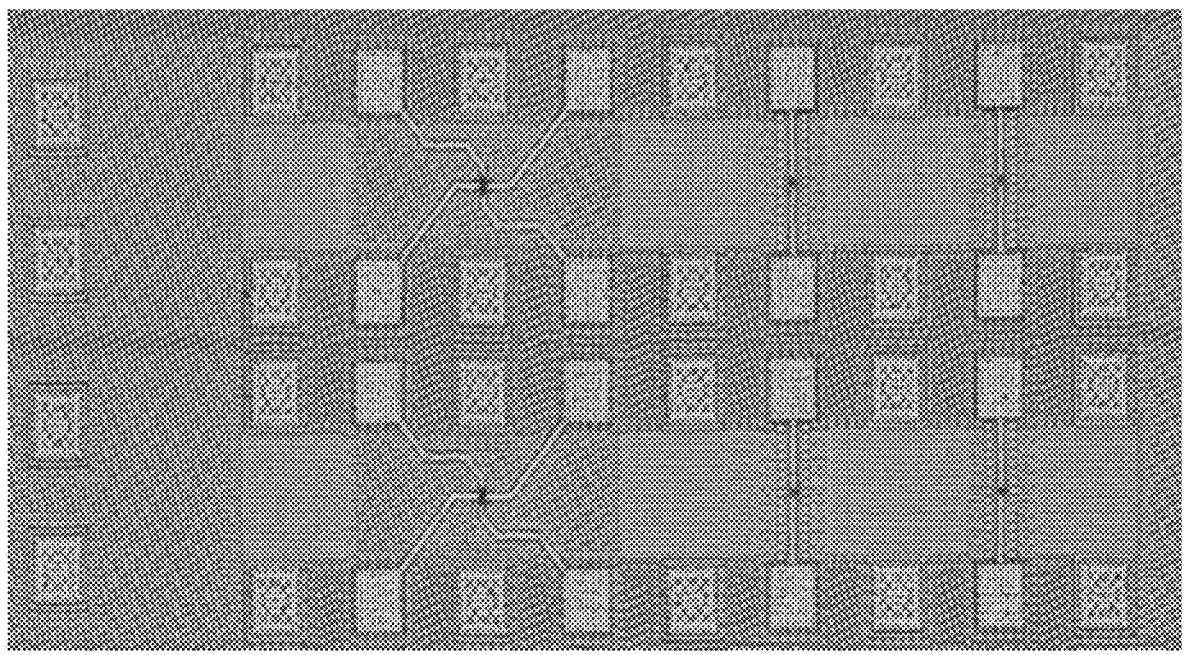
FIG. 5 shows a microphotograph of a qubit embodiment.
Figure 6:
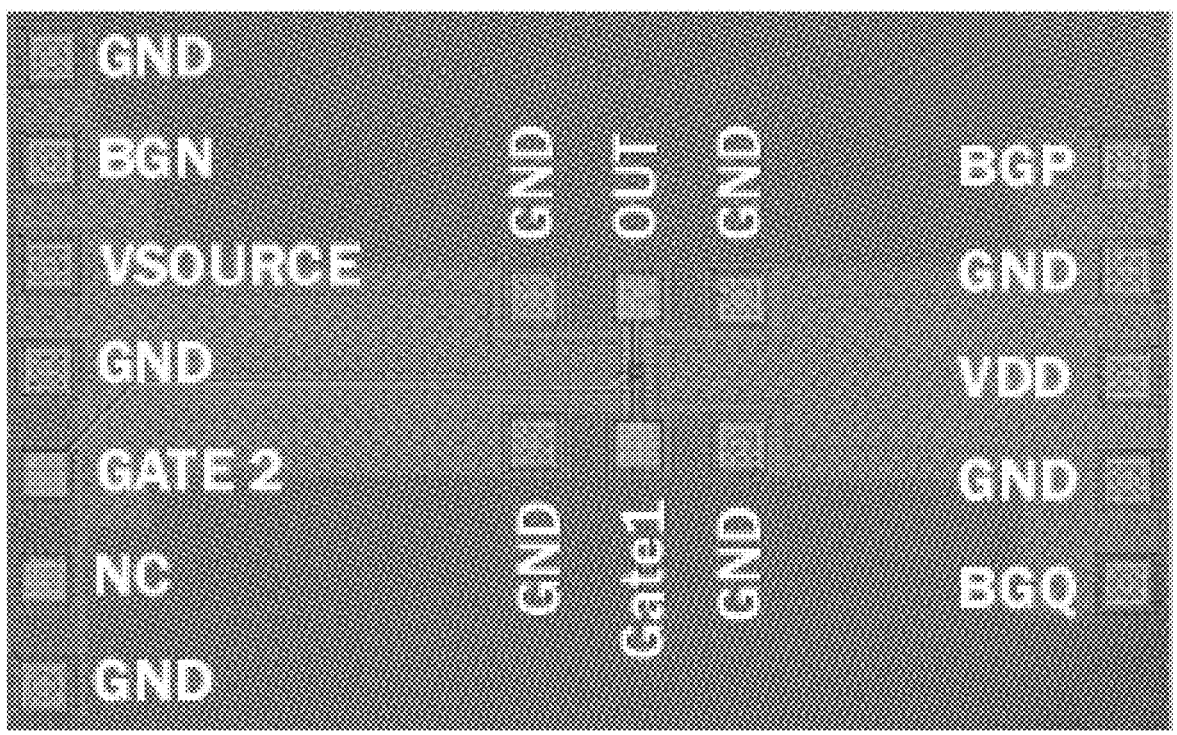
FIG. 6 shows a microphotograph of a qubit embodiment with readout TIA.

According to an embodiment, transistors, qubits, TIAs, qubit-with-TIA circuits, and full quantum processors consisting of qubit-with-TIA and spin-manipulation circuits are fabricated in a production 22 nm FDSOI technology. On-die dc and S-parameter measurements are carried out on such embodiments at 300 K, 2 K, and 3.3 K using a Lake Shore CPX VLT system. A microphotograph of the embodiment tested is shown in FIG. 5 along with a detailed view of the n-qubit with TIA readout IC in FIG. 6.

Figure 7:
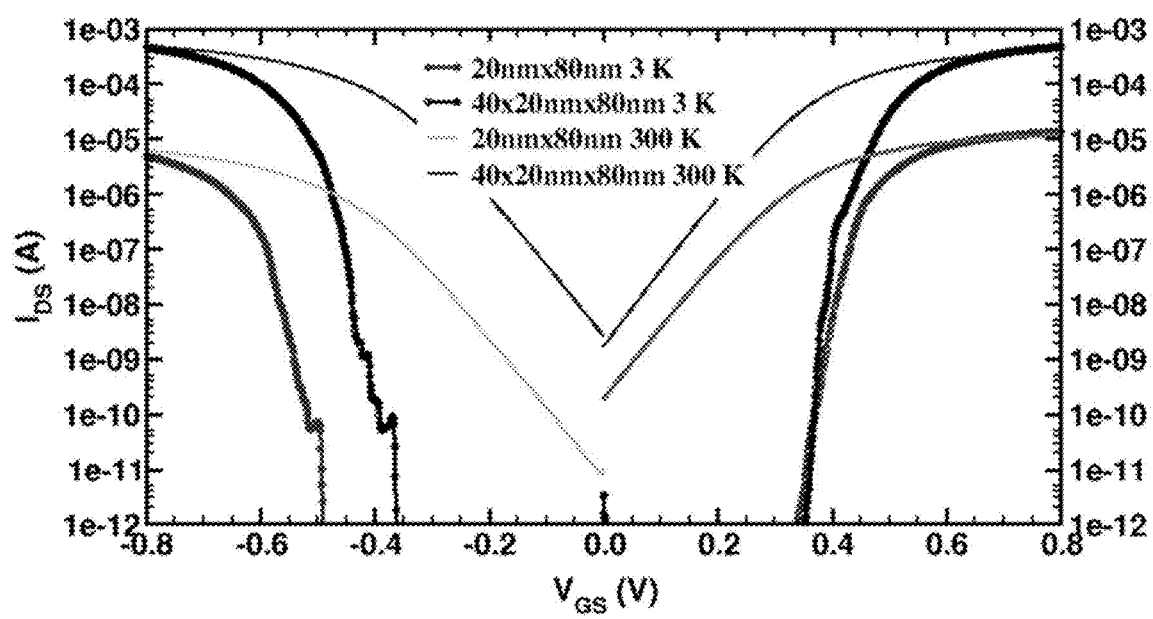
FIG. 7 shows the MOSFET transfer characteristics of an embodiment at $V_{DS}=\pm50$ mV.
Figure 8A:
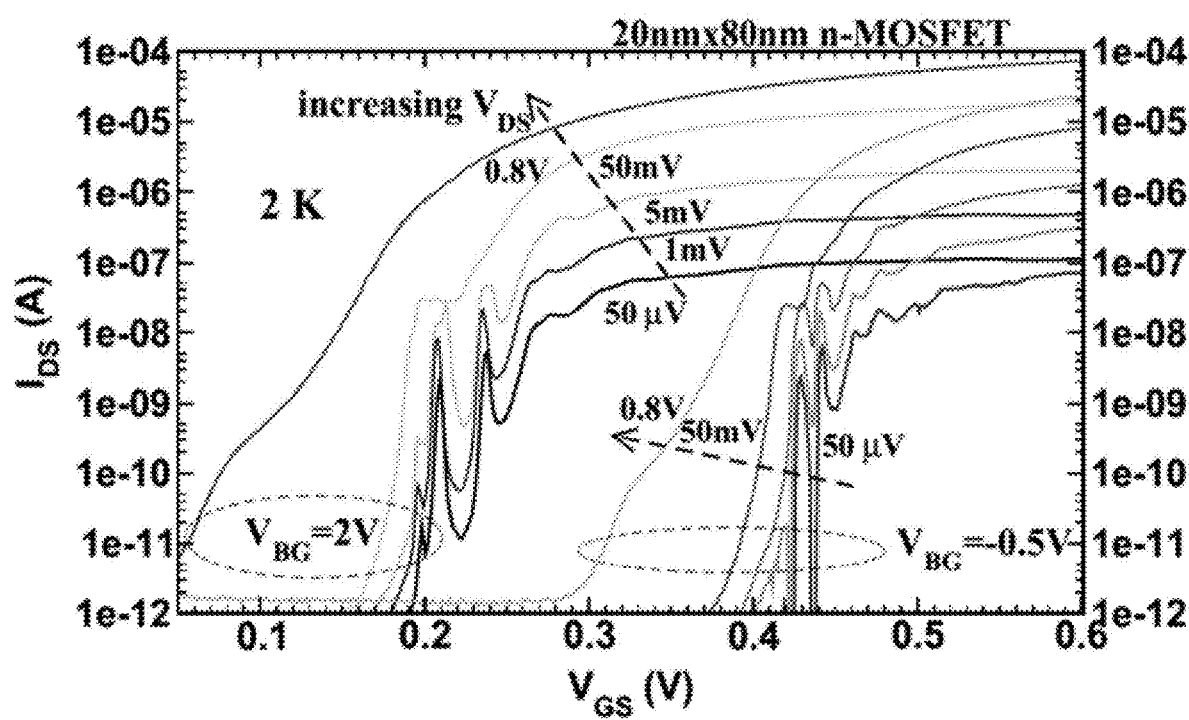
FIGS. 8(a) to 8(b) show the measured transfer characteristics against back gate voltage and $V_{DS}$ at 2 K of n-MOSFET and p-MOSFET embodiments.
Figure 8B:
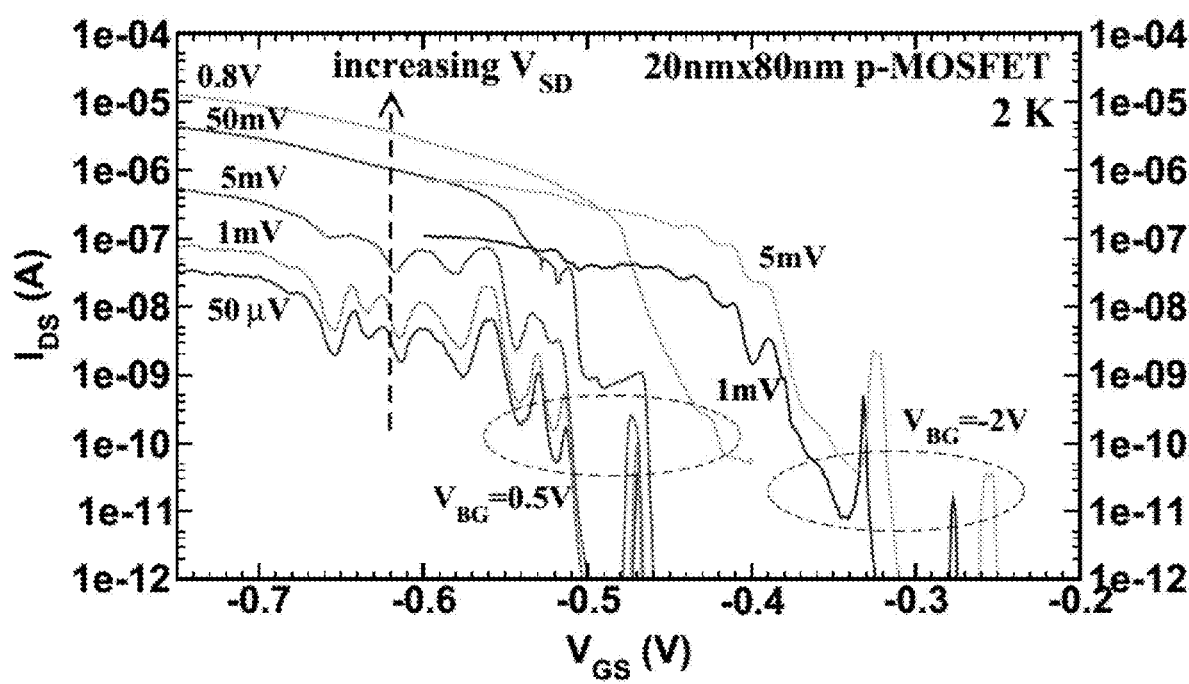

Several notable features appear in the 3.3 K (shown in FIG. 7) and 2 K (shown in FIGS. 8(a) and 8(b)) transfer characteristics of single- and 40 gate finger minimum-size 20 nm by 80 nm MOSFETS at V≤50 mV. First, current steps can be observed in the subthreshold region as the lowermost energy levels due to confinement in the z-direction are being sequentially occupied by electrons and holes, respectively. Second, by connecting 40 gate fingers together, the current steps are amplified in both n- and p-MOSFETs. This feature may be exploited to increase the manufacturability and fidelity of qubits at the hardware level, reducing demand on repeated logic operations for error correction. Third, the current steps transform into oscillations with large peak-to-trough ratios as the temperature is reduced to 2 K and Vis is reduced below 50 mV, as illustrated in FIGS. 8(a) and 8(b) for n- and p-MOSFETS, respectively. The oscillatory behavior is indicative of electron/hole resonant tunneling through the source and drain barriers along the x-direction (see also the inset in FIG. 2(b)). The separation between adjacent peaks, $\Delta V_{GS}$, depends on the energy level in the channel QD and is inversely proportional to the capacitance between the top gate 1300 and the charge centroid in the channel, $C_{gs}+C_{gd}$. The latter can be tuned from the back gate 1400 and increases as the charge moves closer to the top gate 1300 oxide interface. A larger $\Delta V_{GS}$ is desirable to achieve better noise immunity and larger $f_{Rabi}$ when applying the spin control mm-wave signal on the qubit gate as it improves qubit fidelity at higher temperatures and allows for faster quantum processors. According to an embodiment, the larger $\Delta V_{GS}$ of the p-MOSFET is due to the smaller hole effective mass and the additional heterojunction barriers in the valence band along the x-direction which are caused by a larger Ge mole fraction in the source/drain regions compared to in the channel.

Figure 9:
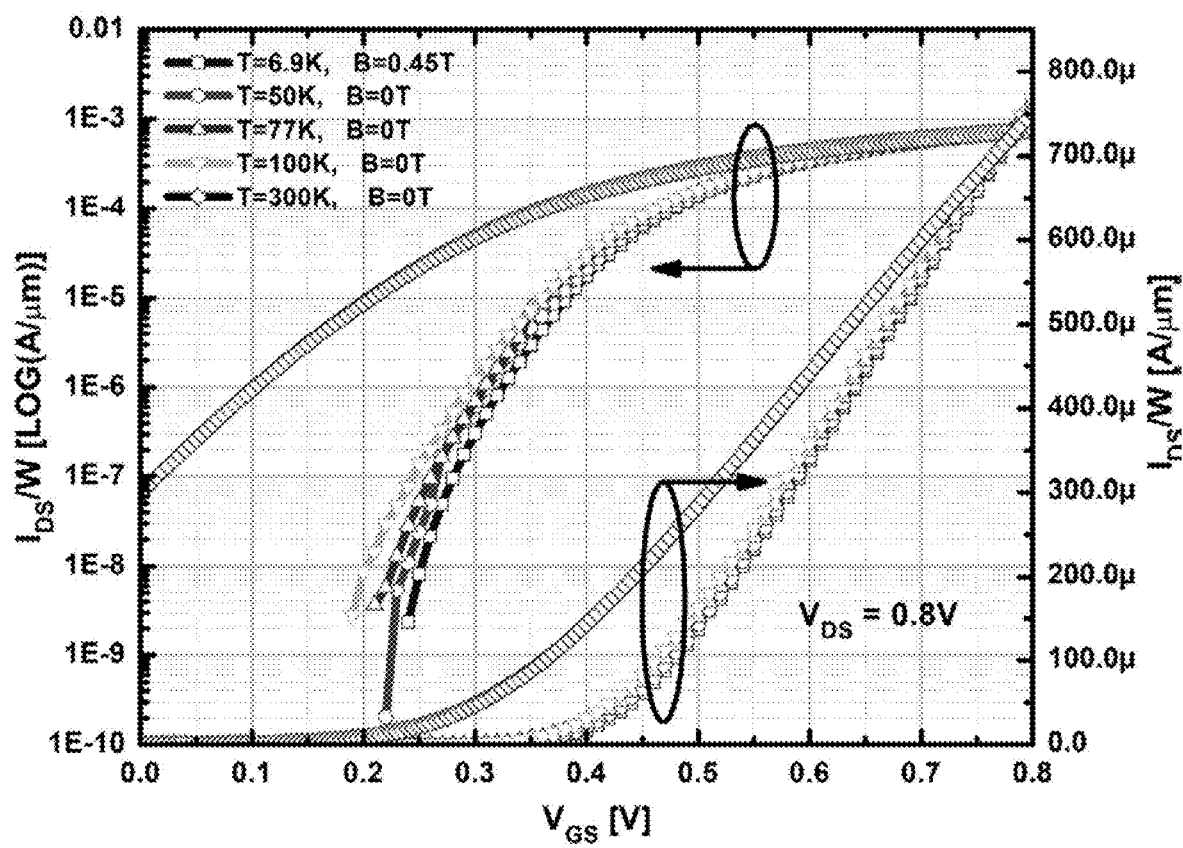
FIG. 9 shows the $I_{DS}$-$V_{GS}$ across several temperatures for an n-MOSFET embodiment.

The 20 nm by 80 nm n-MOSFET embodiment transfer characteristics shown in FIG. 9, which compares $I_{DS}$-$V_{GS}$ against temperature, indicate that most of the $V_t$ shift occurs between 300 and 77 K.

Figure 10A:
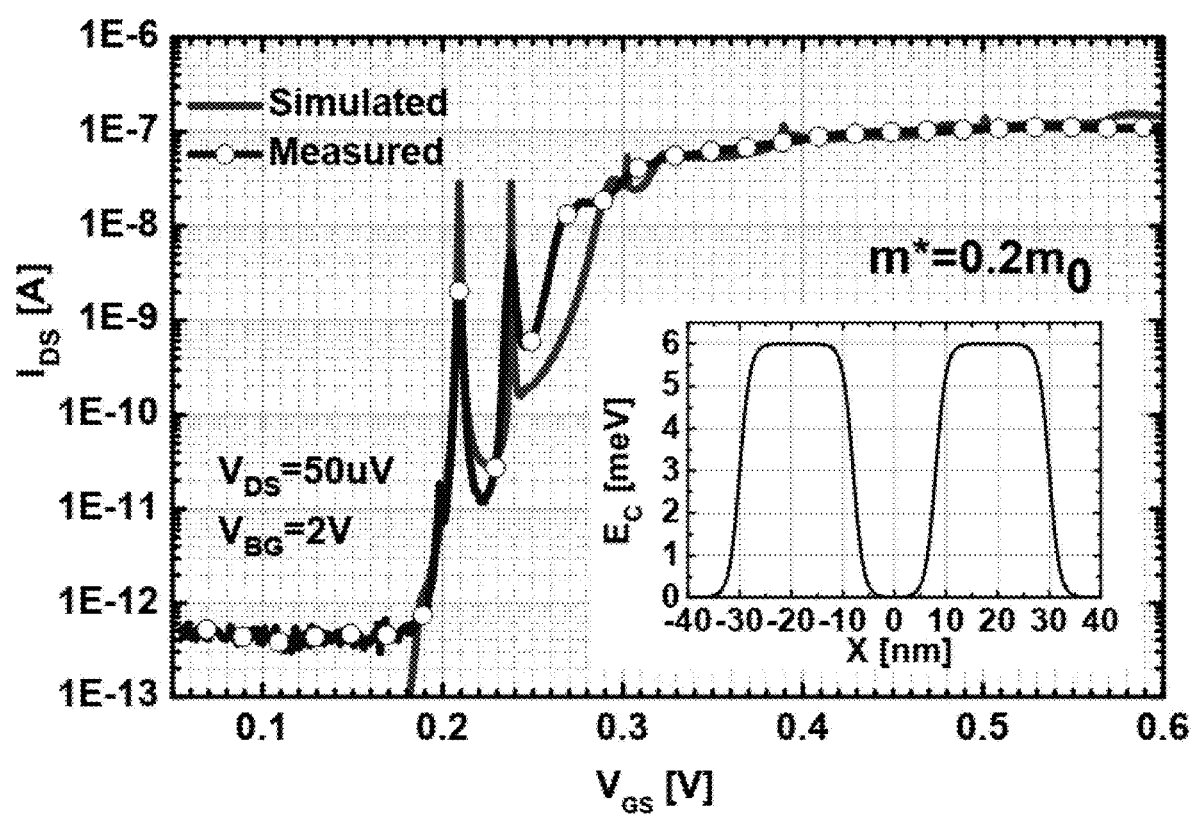
FIGS. 10(a) and 10(b) show the measured against simulated transfer characteristics for n-MOSFET and p-MOSFET embodiments.
Figure 10B:
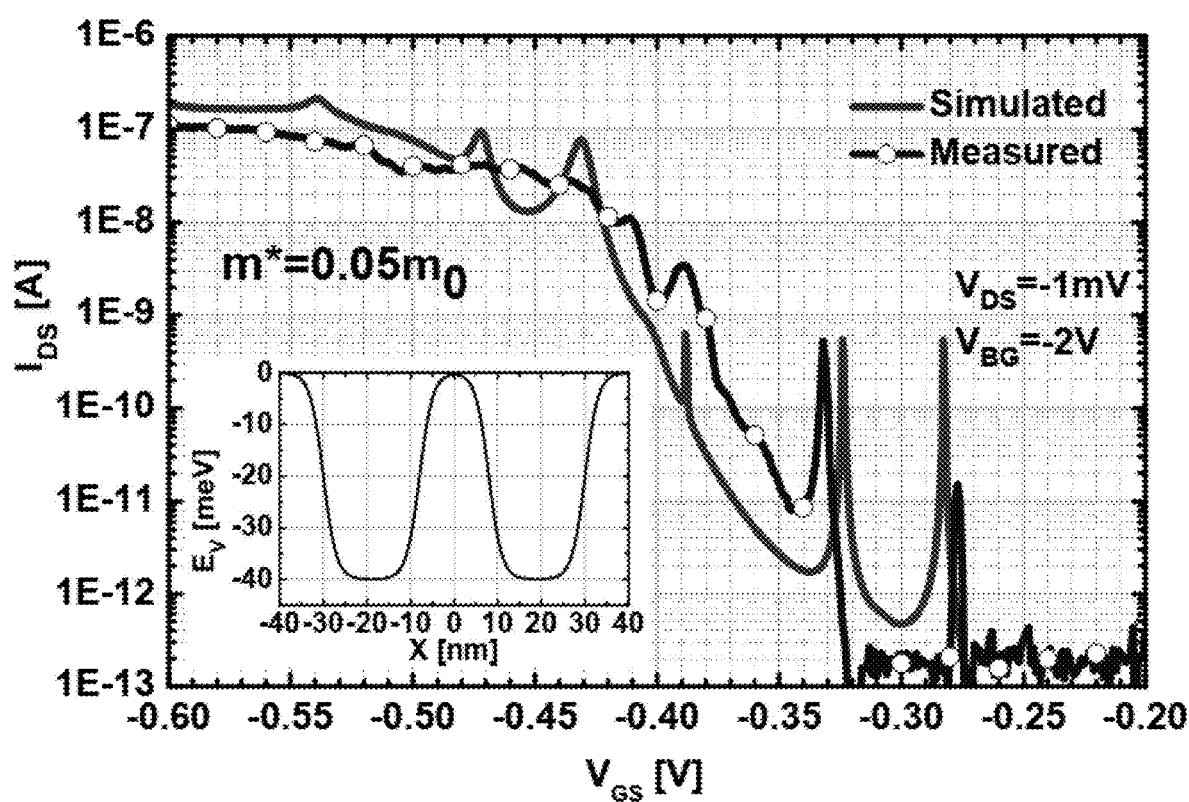

FIGS. 10(a) and 10(b) reproduce the measured and simulated $I_{DS}$ against $V_{GS}$ characteristics of the n- and p-MOSFET QDs according to a 1×20 nm by 80 nm embodiment with ballistic transport and an NEGF formation, with assumed conduction/valence band profile and effective mass shown in the insets. The best fit conduction and valence band profiles are shown in the insets according to an embodiment with 20 nm thick, 6 meV and 40 meV barriers, respectively. The effective masses are chosen for best fit, but are approximately equal to 0.19 $m_0$ transverse electron mass in Si and within the 0.043 $m_0$ to 0.15 $m_0$ light-hole mass range in SiGe at 4.2 K.

Figure 11A:
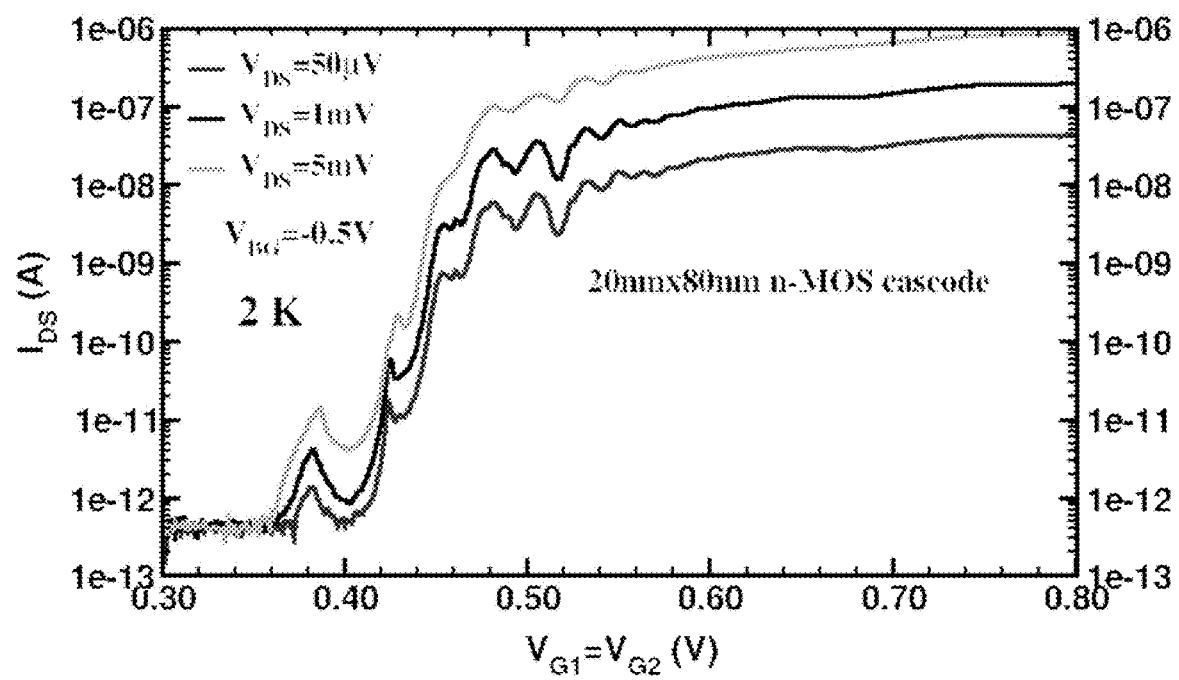
FIGS. 11(a) and 11(b) show the transfer characteristics against $V_{DS}$ at $V_{BG}=\pm0.5$V and 2 K for DQD n-qubit and p-qubit embodiments.
Figure 11B:
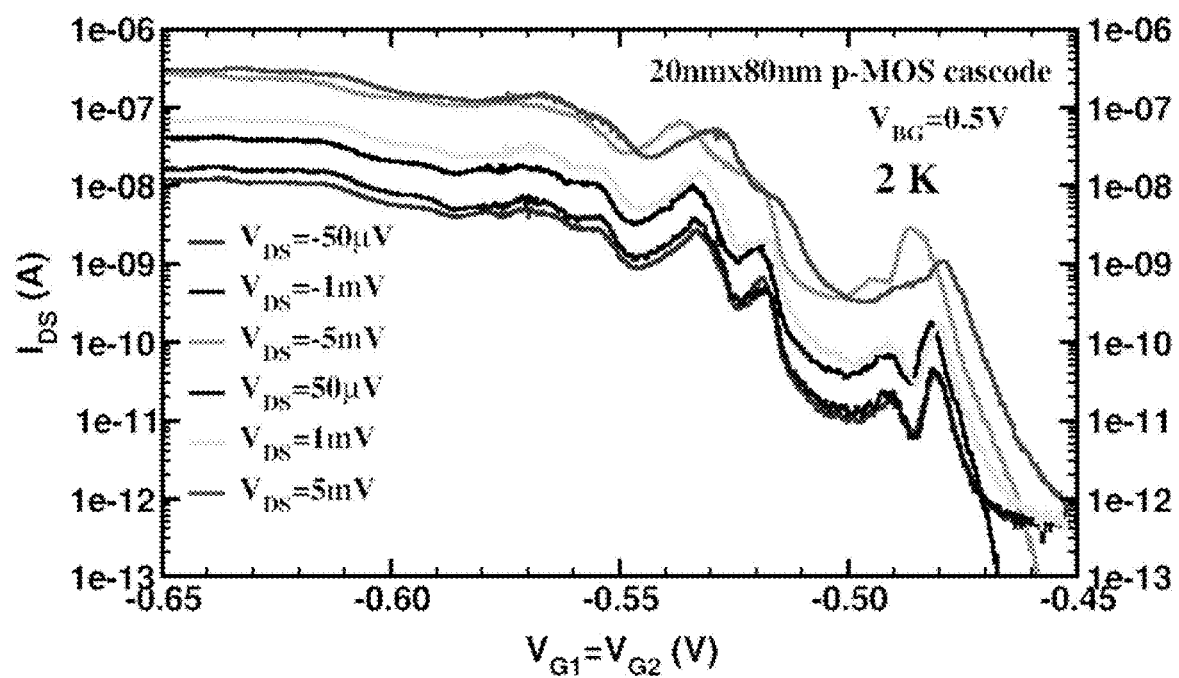

FIGS. 11(a) and 11(b) reproduce the measured transfer characteristics (with $V_{G1}=V_{G2}$) of the electron- and hole-spin coupled double QB qubits, respectively, showing resonant tunneling through the three barriers and two wells. The $V_{G1}=V_{G2}$ location of the tunneling peaks in the electron- and hole-spin DQD device embodiments remains practically constant for $|V_{DS}|<5$ mV, which is a $V_{DS}$ range large enough to support high-fidelity spin-readout circuit design and operation.

Figure 12:
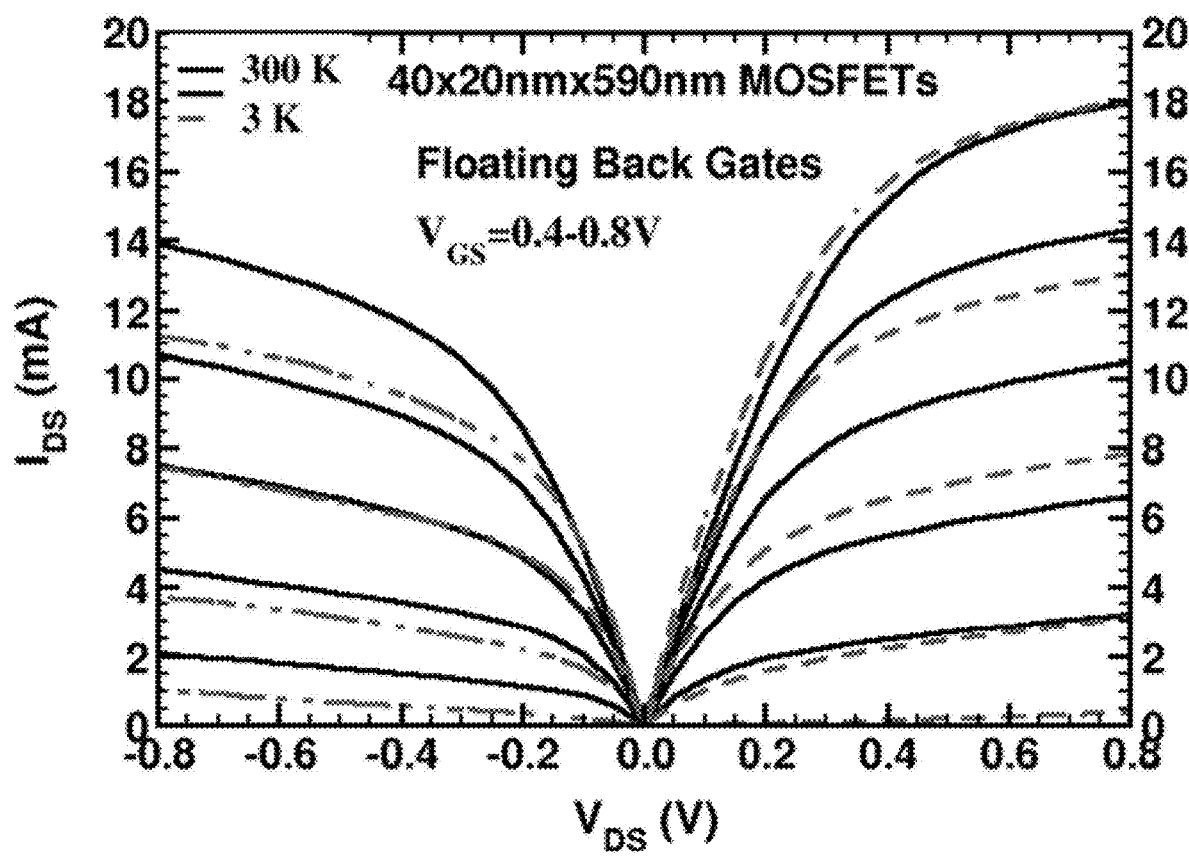
FIG. 12 shows the n-MOSFET output characteristics of an embodiment.
Figure 13:
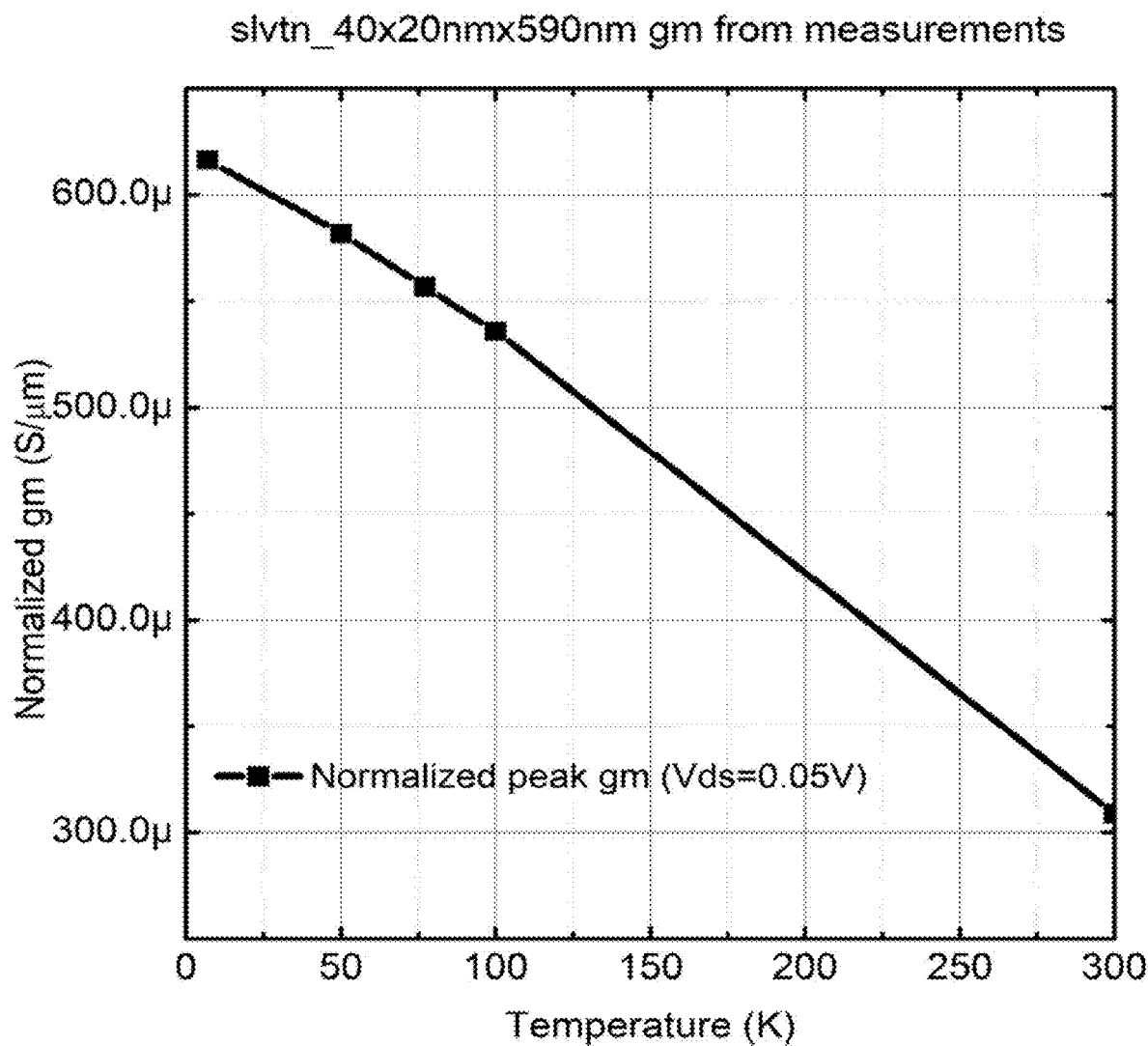
FIG. 13 shows the peak linear $g_m$ against temperature data of an embodiment.
Figure 14A:
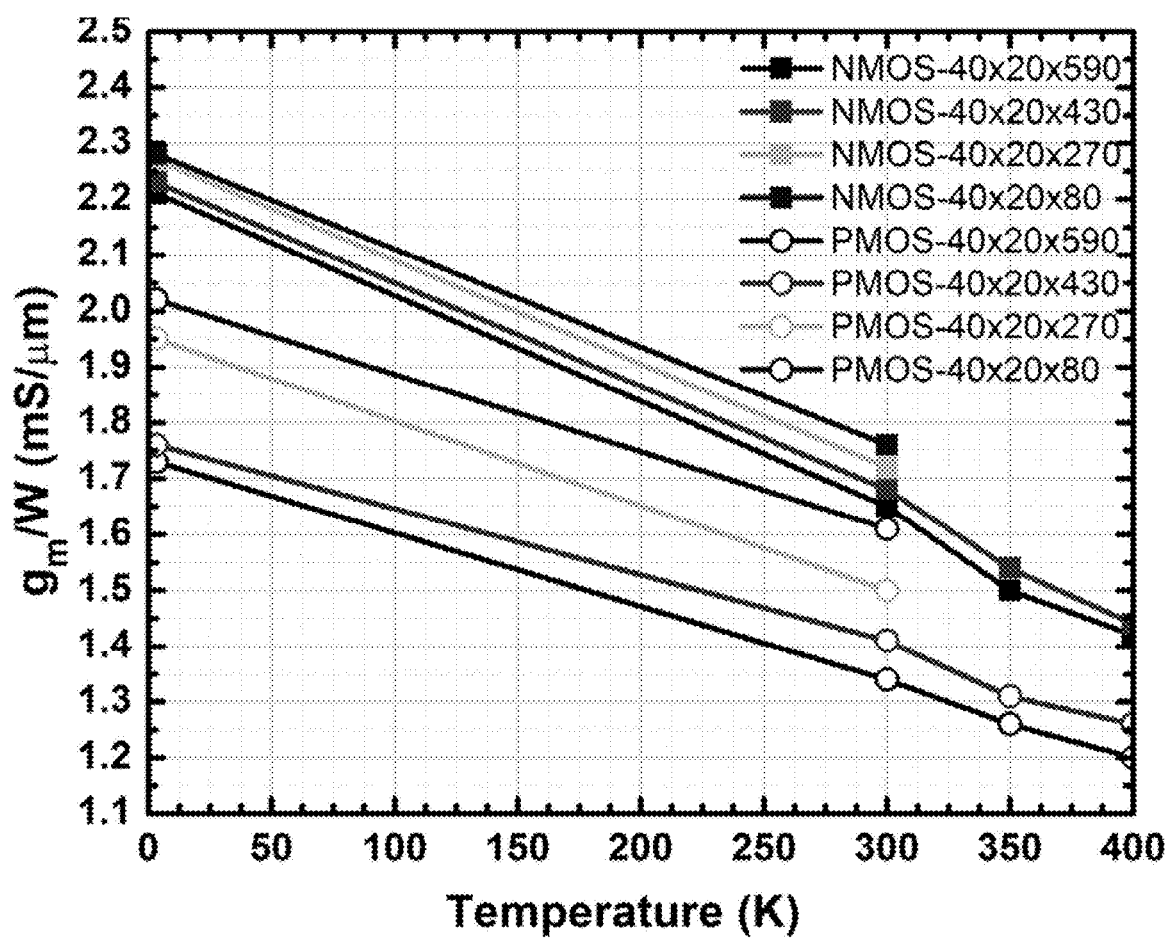
FIGS. 14(a) to 14(c) show saturation region data for various MOSFET embodiments at $V_{DS}=\pm0.8$ V.
Figure 14B:
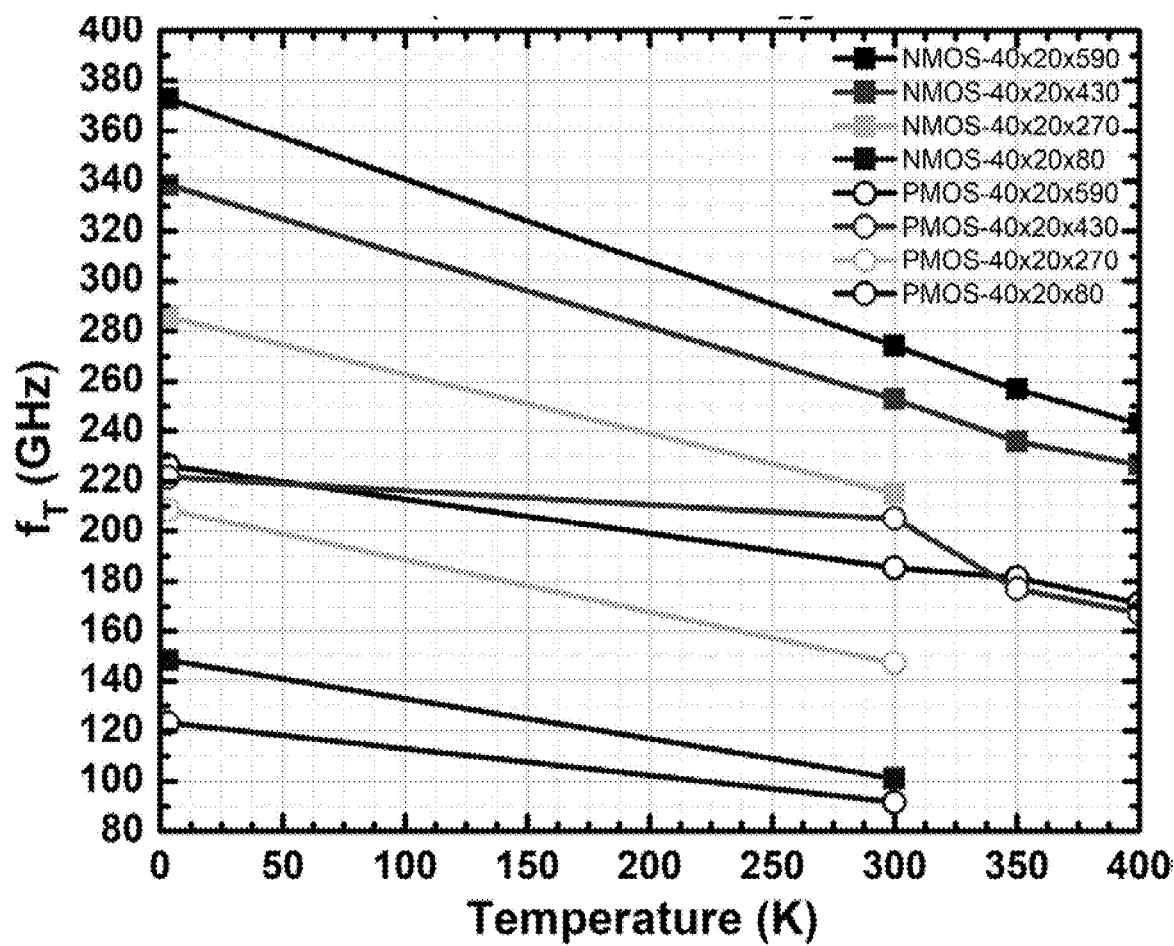
Figure 14C:
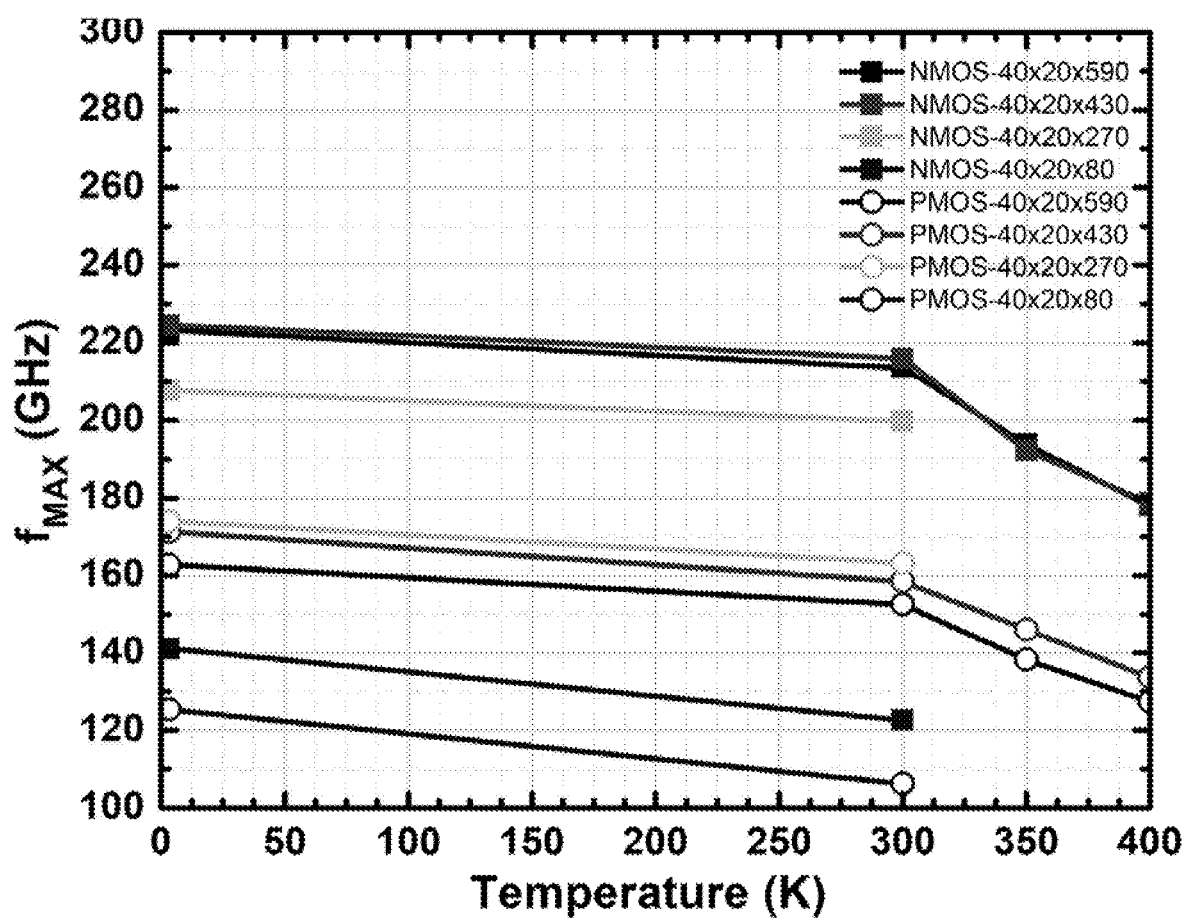
Figure 15A:
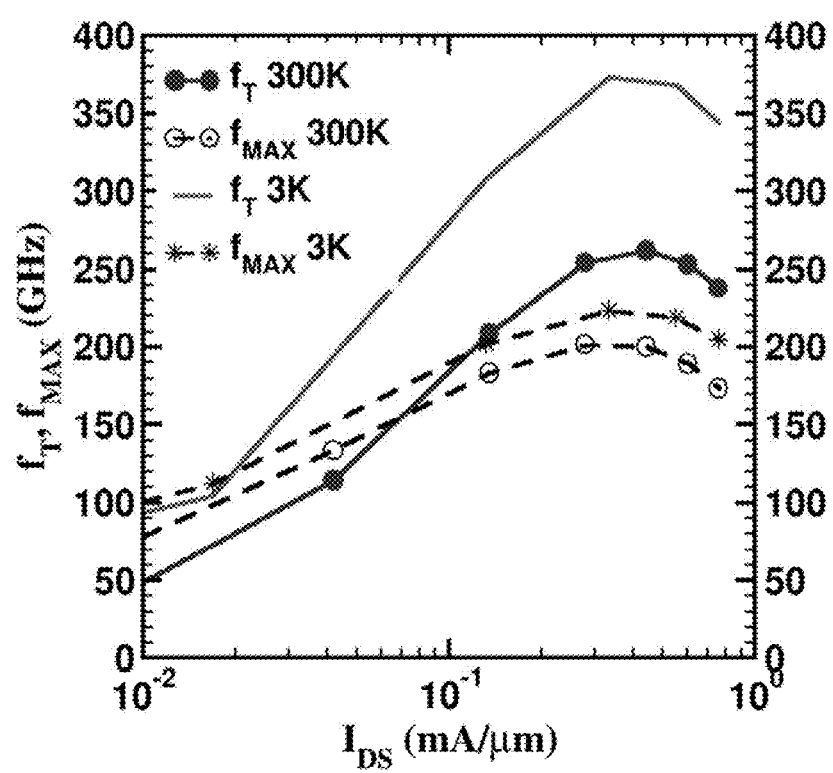
FIGS. 15(a) to 15(d) show measured characteristics for a 40×20 nm by 590 nm n-MOSFET embodiment at 300 K and 3.3 K.
Figure 15B:
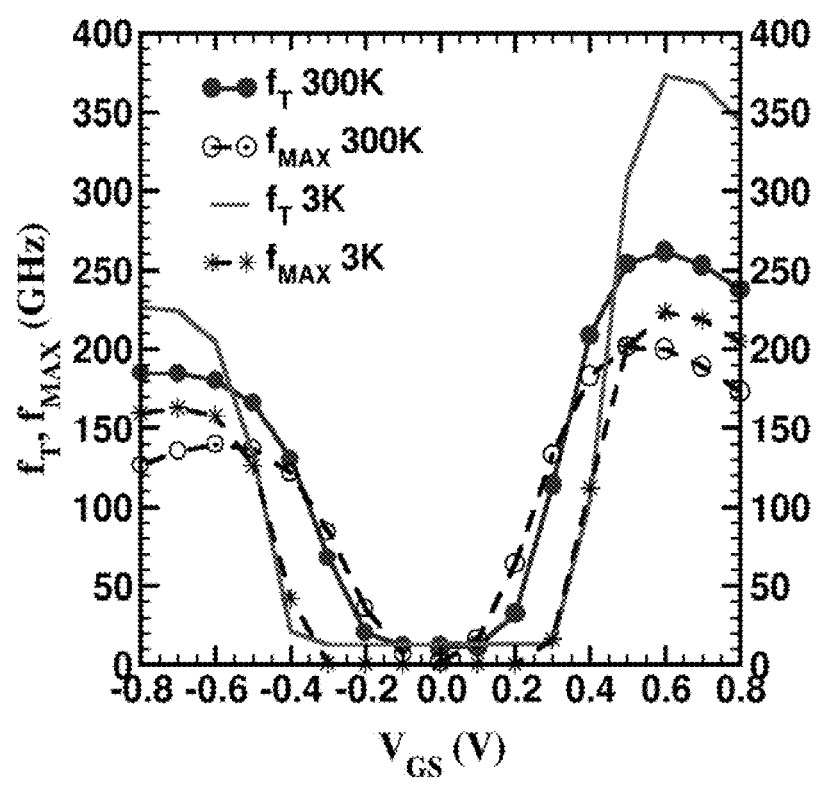
Figure 15C:
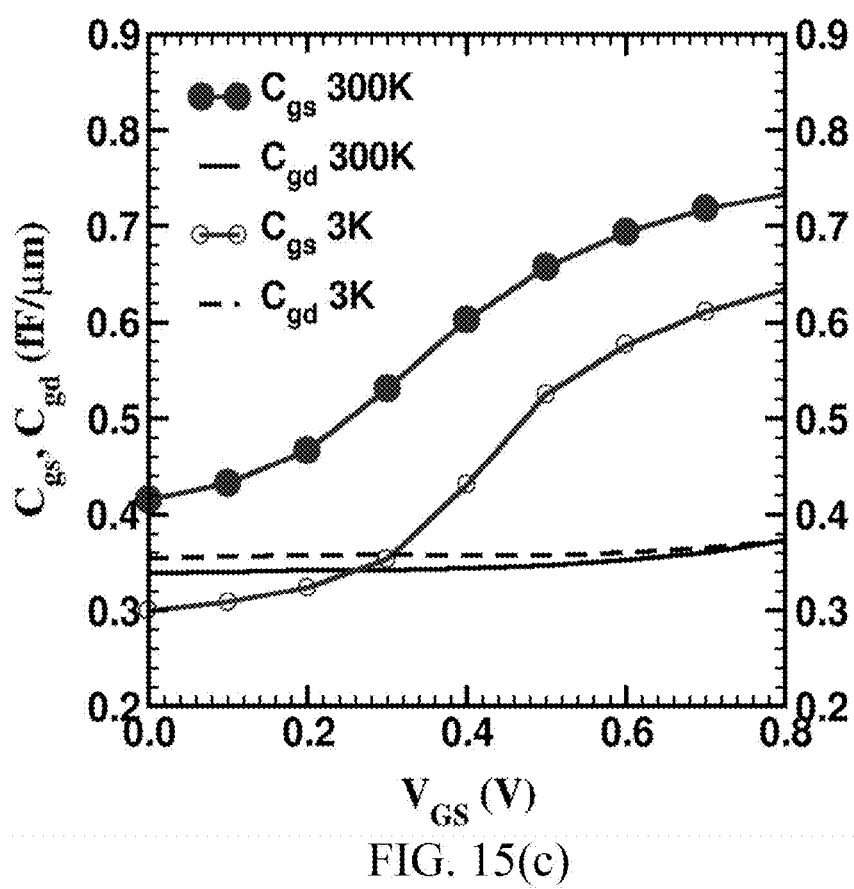
Figure 15D:
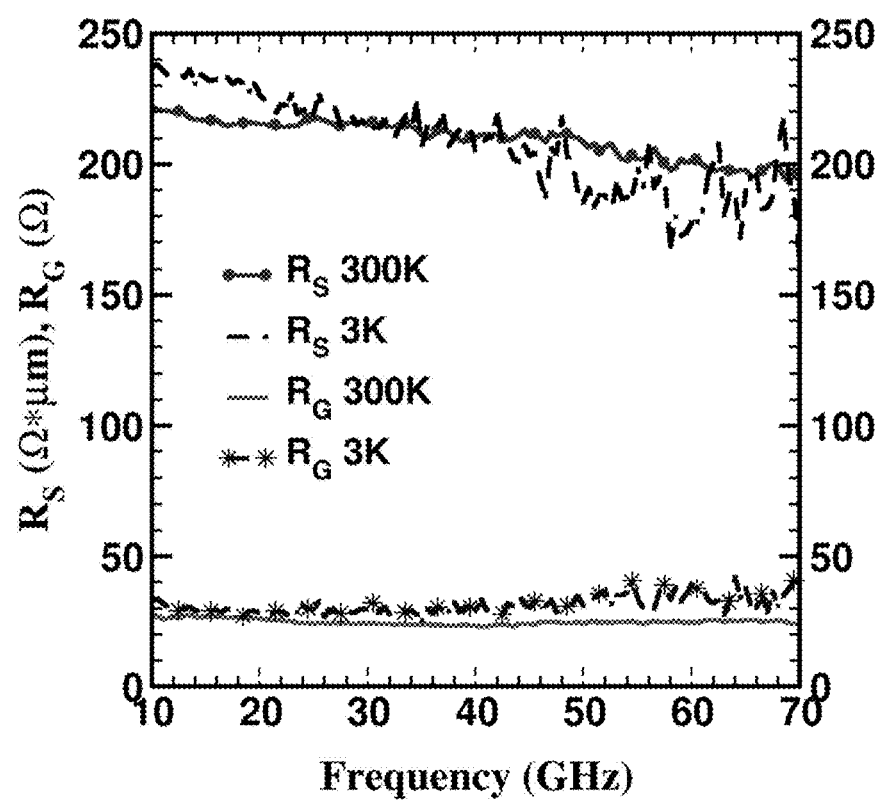

FIGS. 12 to 15 are a compilation of the measured output characteristics of various embodiments, with the small signal equivalent circuit parameters and high frequency figures of merit for several p- and n-channel MOSFETS showing 100% increase in linear region transconductance, 25-40% in the peak transconductance in saturation, $C_{GS}$ and $f_r$ at 3.3 K, 5-10% in $f_{MAX}$, and less than 10% degradation in source resistance ($R_s$), gate resistance ($R_g$), and $C_{gd}$. In particular, FIG. 12 shows n-MOSFET output characteristics for a 40×20 nm by 590 nm MOSFET embodiment, whereas FIG. 13 shows the peak linear $g_m$ vs. temperature for a 40×20 nm by 590 nm MOSFET embodiment. FIG. 14(a) shows the peak $g_m$ against temperature, FIG. 14(b) shows the peak $f_r$ against temperature, and FIG. 14(c) shows the $f_{MAX}$ against temperature, each in the saturation for various MOSFET embodiments at $V_{DS}=\pm 0.8$V. The $f_{MAX}$ against $I_{DS}$, $f_{MAX}$ against $V_{GS}$, $C_{gs}$, $C_{gd}$ against $V_{GS}$, and extracted $R_{GS}$, $R_S$ against frequency output data are shown for a 40×20 nm by 590 nm embodiment in FIGS. 15(a), 15(b), 15(c), and 15(d) respectively.

Figure 16:
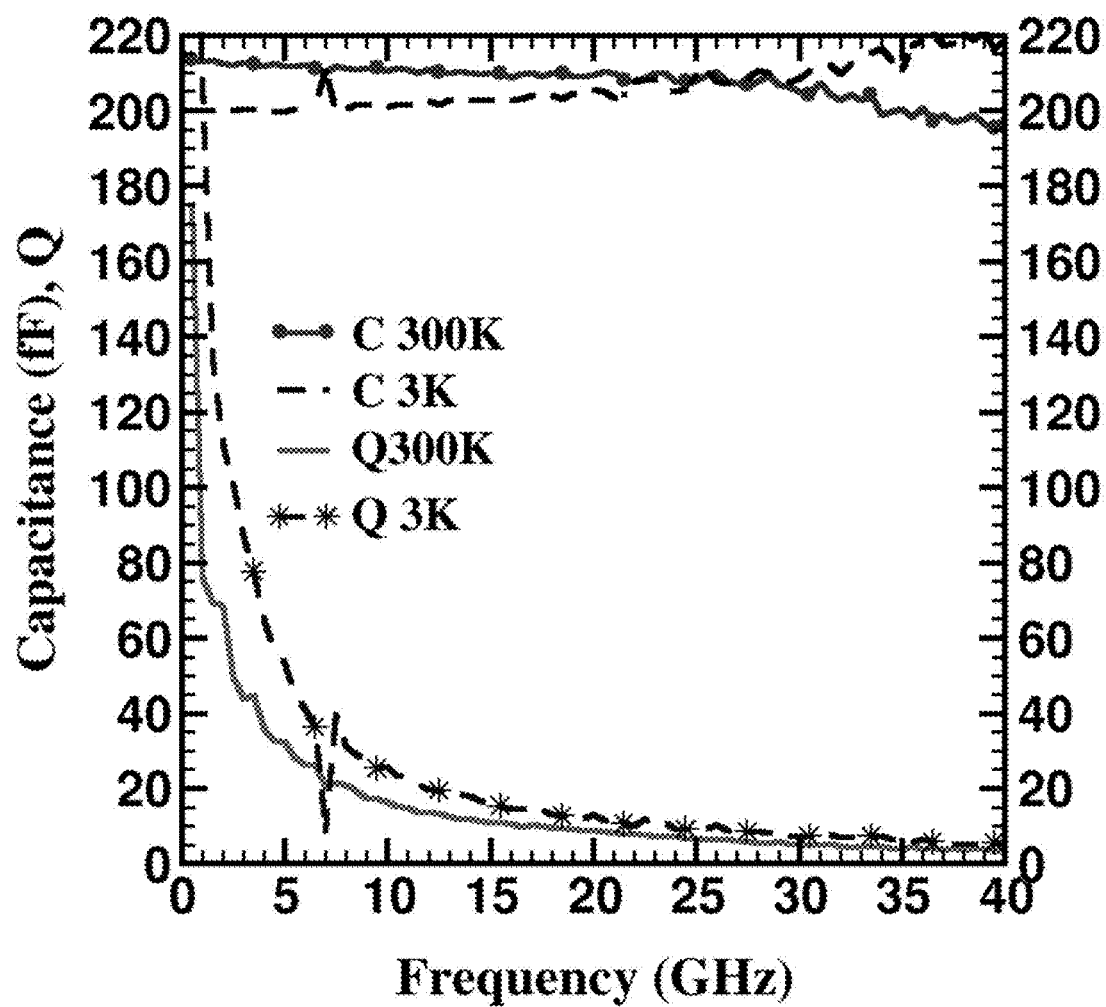
FIG. 16 shows the MOM capacitance and Q of an embodiment.
Figure 17:
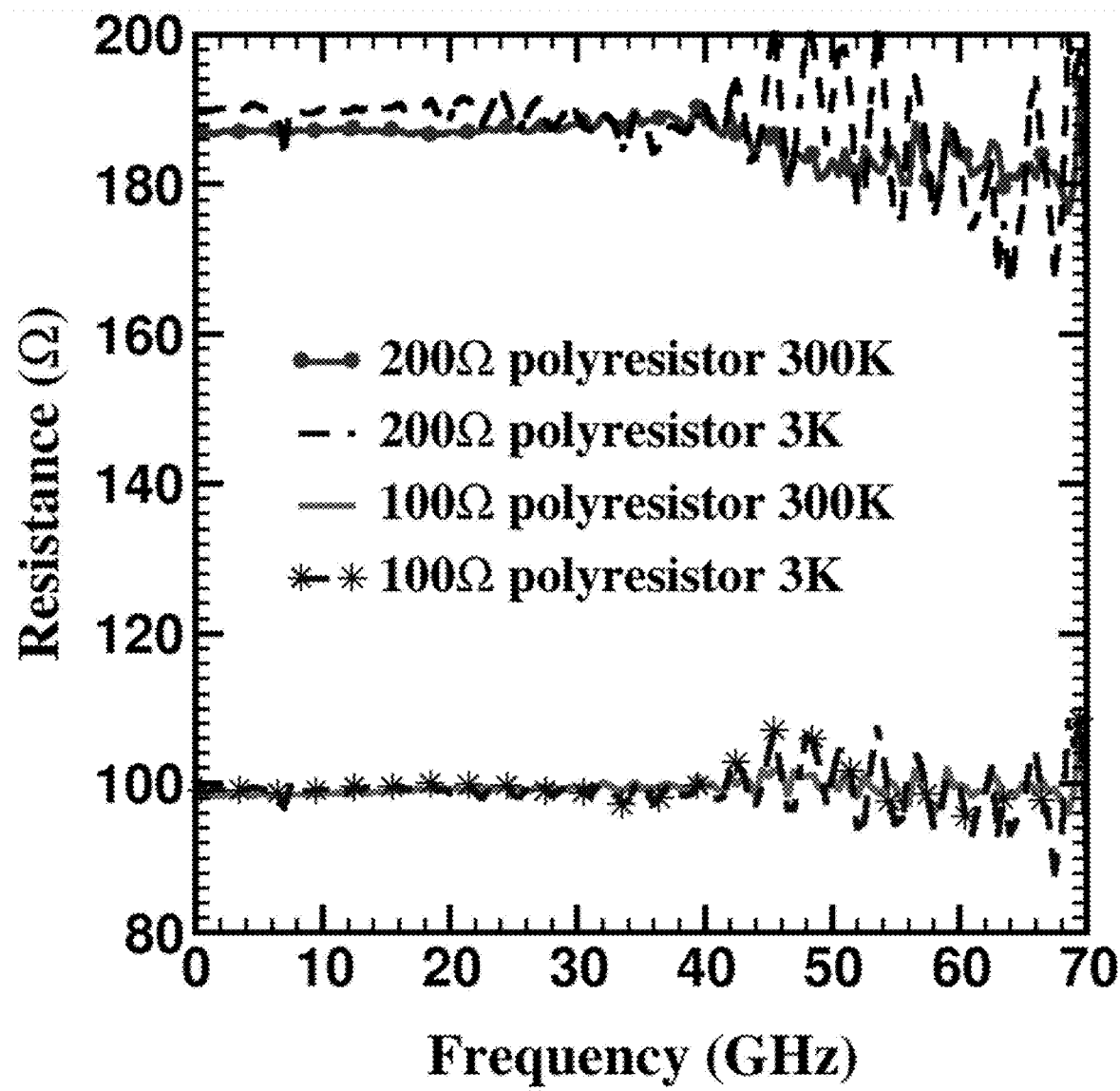
FIG. 17 shows the resistance against frequency data for 100Ω and 200Ω polyresistors at 300 K and 3 K.
Figure 18:
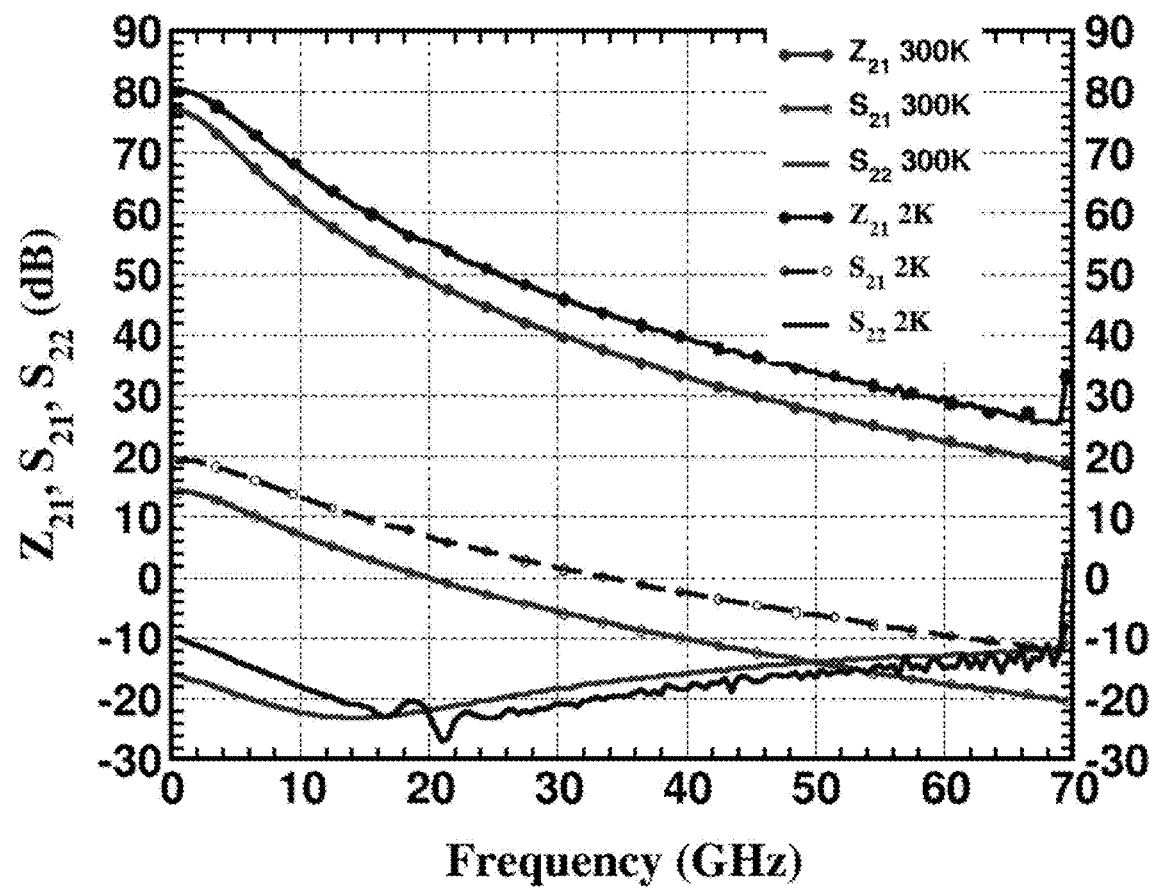
FIG. 18 shows the measured TIA of an embodiment at 300 K and 2 K.
Figure 19:
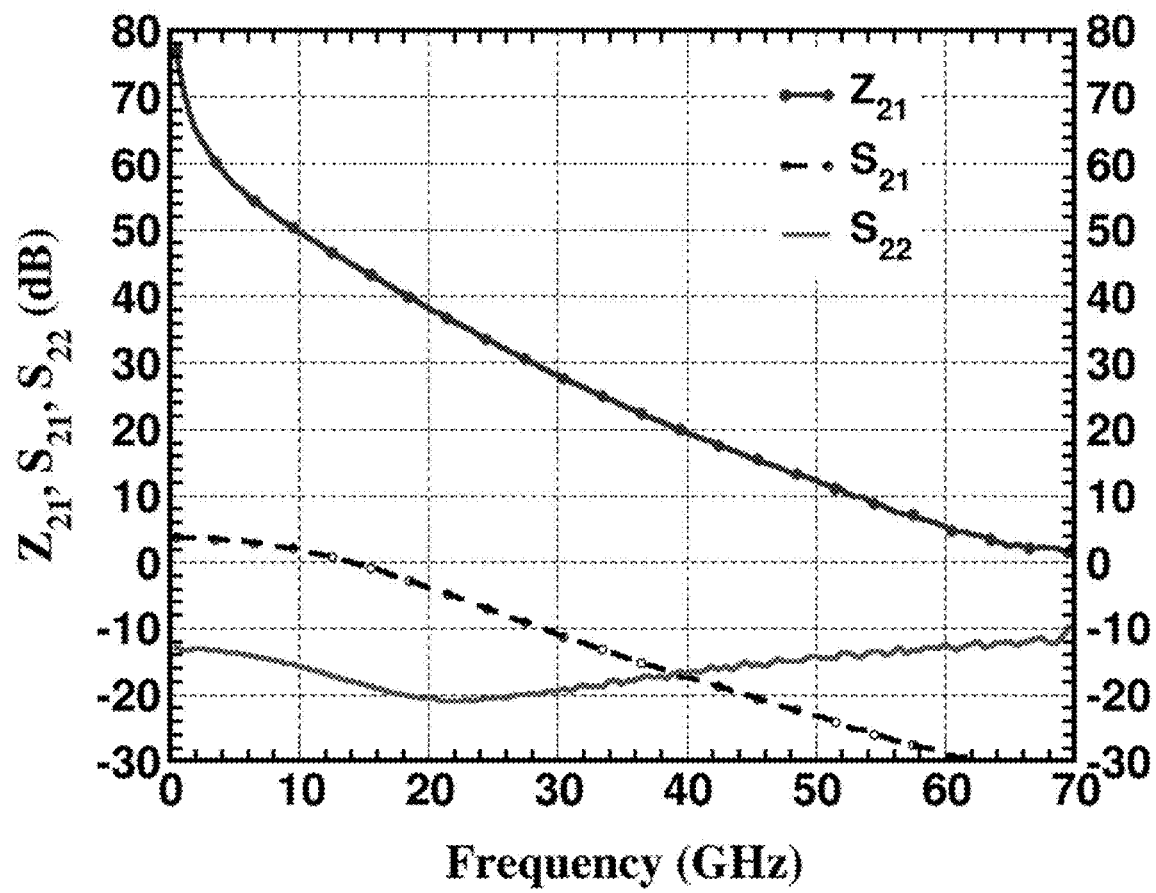
FIG. 19 shows $Z_{21}$, $S_{21}$, and $S_{22}$ data for an n-qubit embodiment with TIA readout at 300 K.

Furthermore, the MOM capacitance data in FIG. 16 and the poly resistance data in FIG. 17 vary by less than 5% while the MOM capacitor Q improves at 3.3 K. FIG. 18 shows that the TIA gain improves at 2 K while $S_{22}$ is unchanged. In an embodiment where the TIA is integrated with the n-qubit, FIG. 19 shows that at 300 K $Z_{21}$ is preserved while the unity gain bandwidth exceeds 70 GHz.

Monolithic Qubit ICs

Figure 20A:
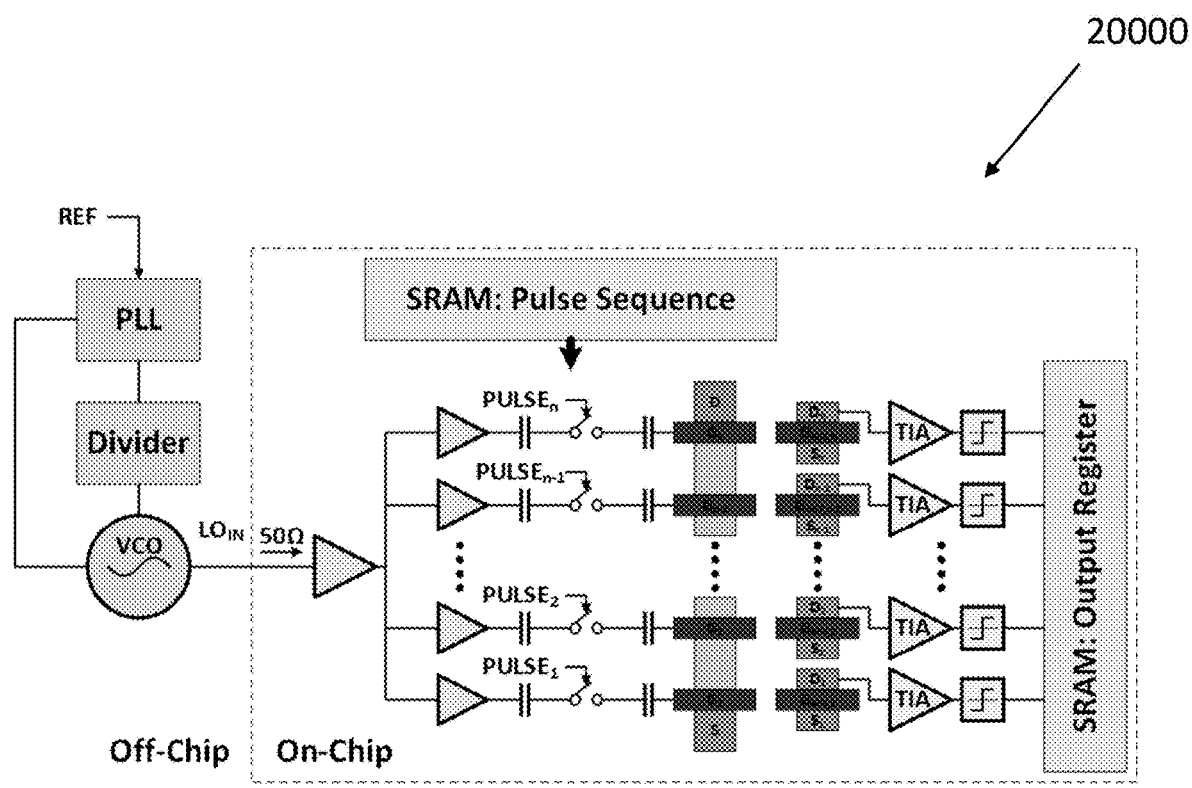
FIGS. 20(a) and 20(b) show direct-modulation monolithic quantum processor architecture and 2D tunnel-coupled qubit array layout scheme embodiments.
Figure 20B:
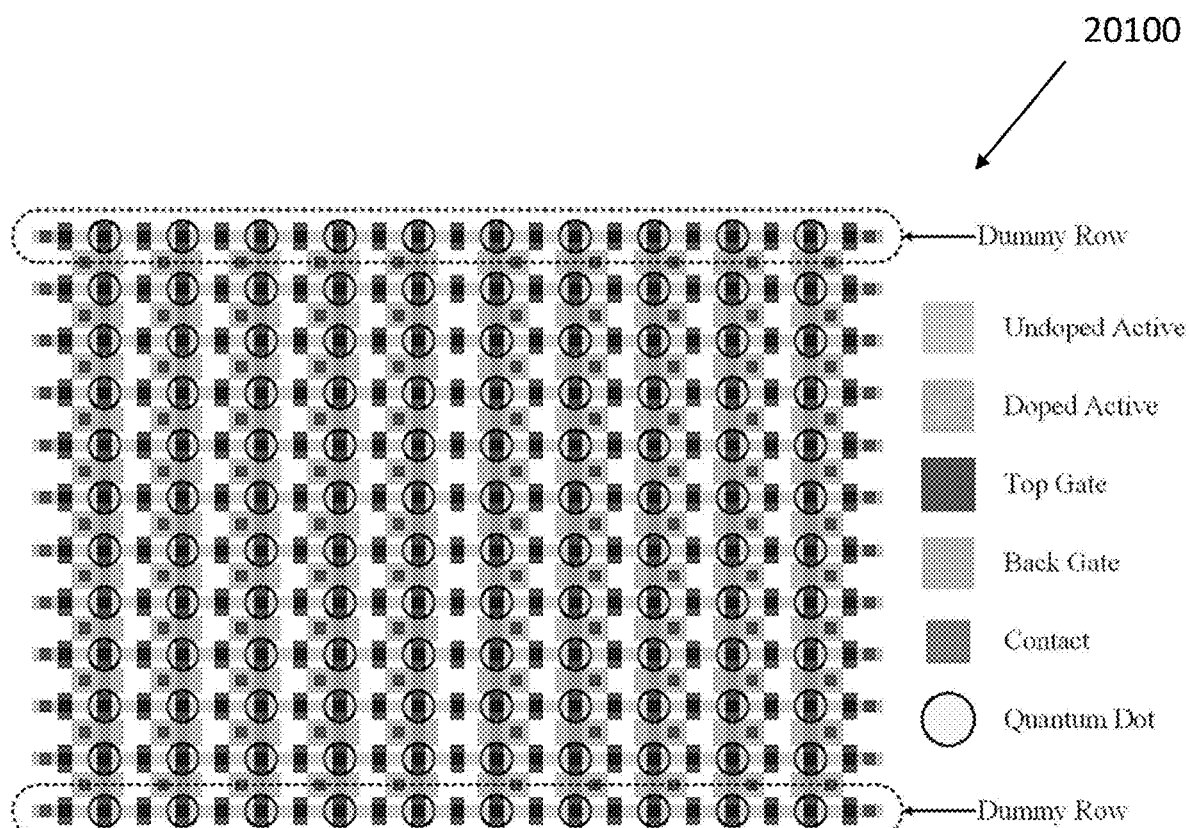

FIG. 20(a) shows an embodiment of a monolithic processor architecture 20000 integrating 80-240 GHz spin manipulation electronics with potentially billions of qubits and readout circuitry on the same die. According to an embodiment, this may allow for short, 20 ps spin control pulses, 1000 times faster than in the latest 53-qubit Google™ quantum processor, to compensate for the likely short spin phase coherence lifetimes, expected to be in the 100 ns to 1 μs range. According to an embodiment, the quantum processor core consists of linear arrays of coupled QD spin qubits. Given the manufacturing constraints of nanoscale production CMOS technologies, 2D tunable coupling of these spin qubits, needed for a full 2D processor architecture, is a challenge. According to a further embodiment shown in FIG. 20(b), processes and mask waivers accommodate such a 2D array 20100 of tunnel-coupled QDs. According to an embodiment, other 2D arrays of tunnel-coupled QDs are explored through nanofabrication. According to an embodiment, qubits may be coupled in the second dimension through spin-to-mm-wave/THz/optical photon coupling.

Figure 21A:
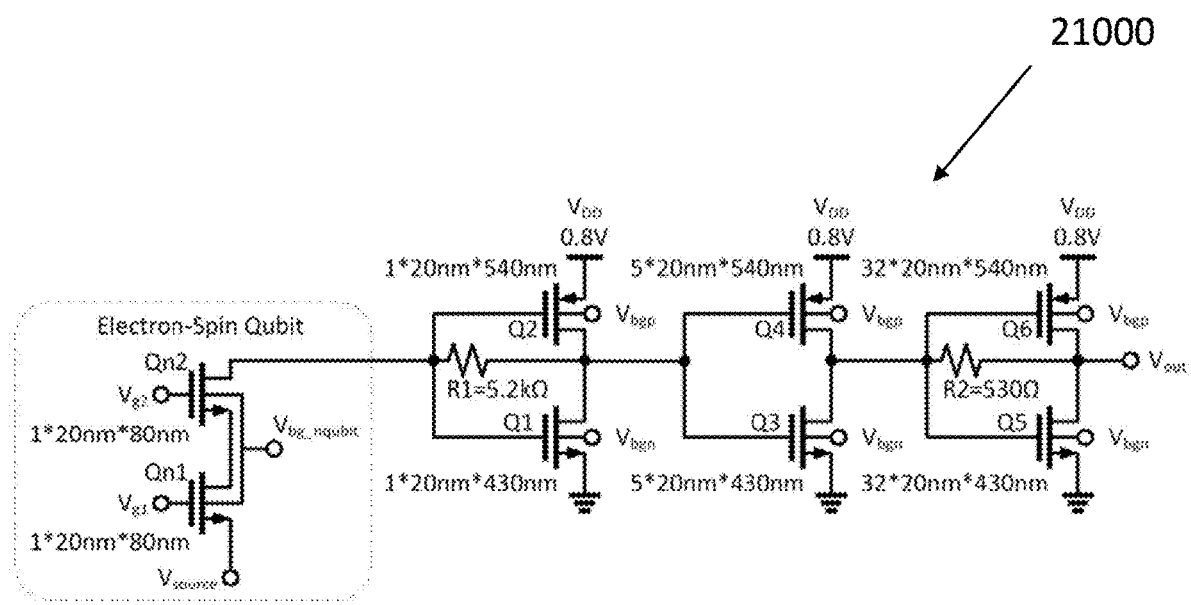
FIGS. 21(a) to 21(c) show schematic diagrams of electron-spin qubit-with-TIA circuit embodiments and measured against simulated $S_{21}$ gain of electron-spin qubit plus TIA in 22 nm FDSOI embodiments.
Figure 21B:
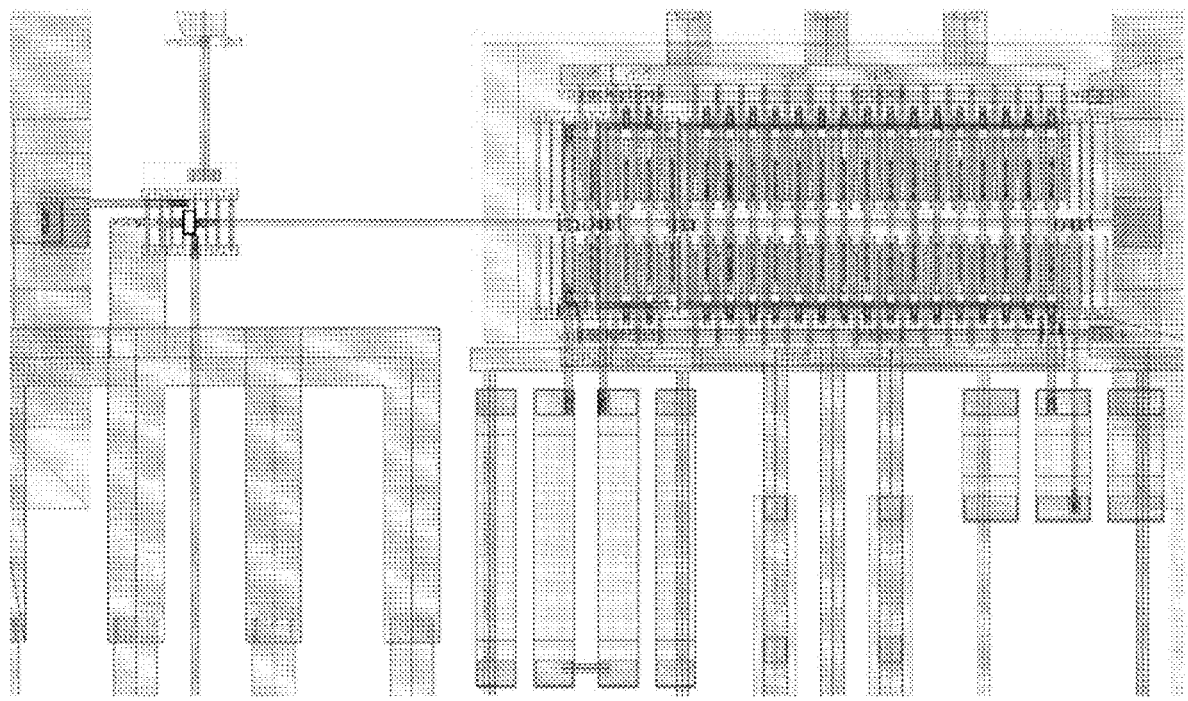
Figure 21C:
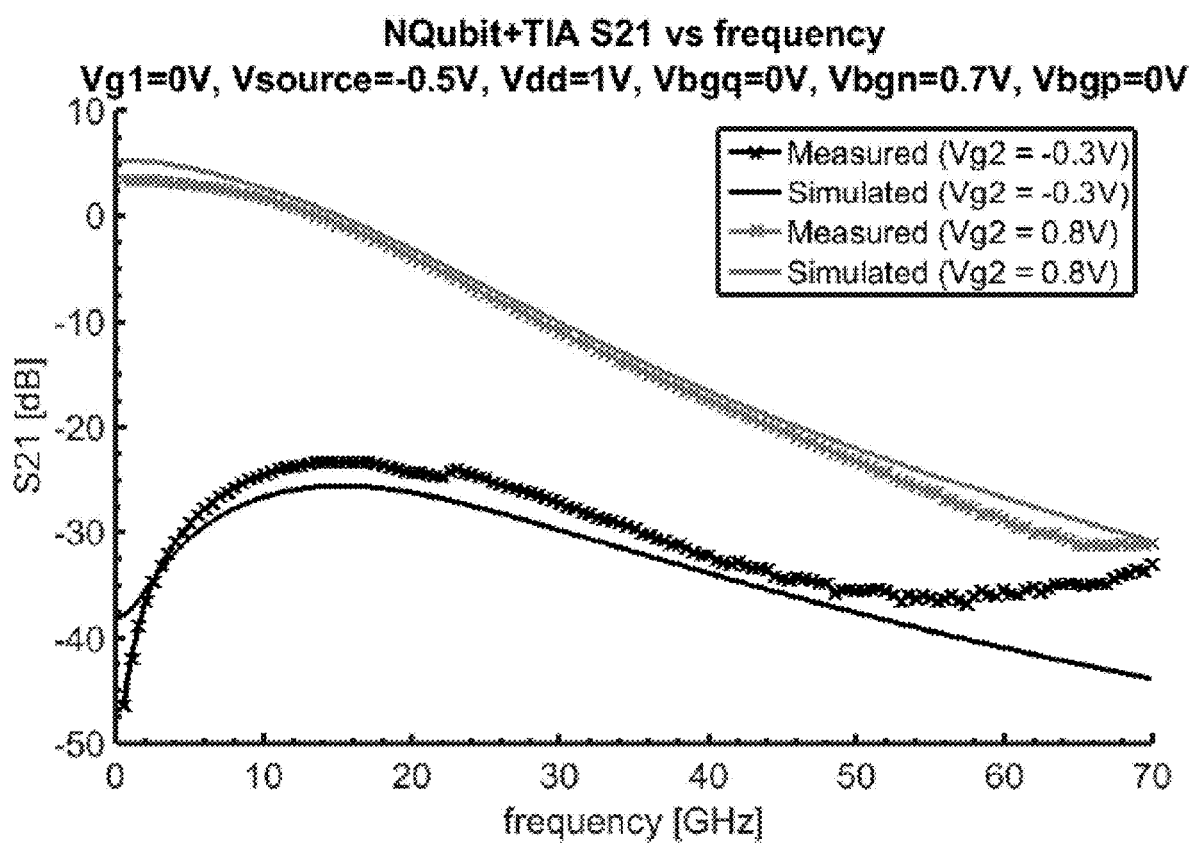

According to an embodiment, the TIA 21000 is designed as shown in FIG. 21(a) with gain, bandwidth, and 50Ω output impedance that does not overload a ~60 aF output capacitance of the DQD qubit. A further embodiment of an electron-spin qubit with a TIA embodiment layout in 22 nm FDSOI is shown in FIG. 21(b), with measured against simulated $S_{21}$ gain of electron-spin qubit plus TIA in 22 nm FDSOI shown in FIG. 21(c).

Ideally, the ~1 nA tunneling peaks in FIGS. 8, 10, and 11 require at least 140 dBΩ of transimpedance gain for the readout TIA to reach 10 mV of amplitude in a 50Ω load. According to an embodiment, part of this gain is implemented off chip to avoid oscillation. According to an embodiment, a monolithic quantum processor may further be optimized for 80 dBΩ gain at 2 K, as shown in the measurements of FIG. 18.

Collectively, the results and cryogenic measurements of transistors, polysilicon resistors, and MOM capacitors demonstrate that all components of the embodiment with production 22 nm FDSOI technology operate with better performance at 2 K than at 300 K, and that monolithic integration of quantum dot qubits and readout circuitry is possible at 2 K. It can also be seen in FIG. 18 and FIG. 19 that the $S_{22}$ of the TIA and qubit-with-TIA remains better than −10 dB up to 70 GHz both at 300 K and 2 K.

Figure 22:
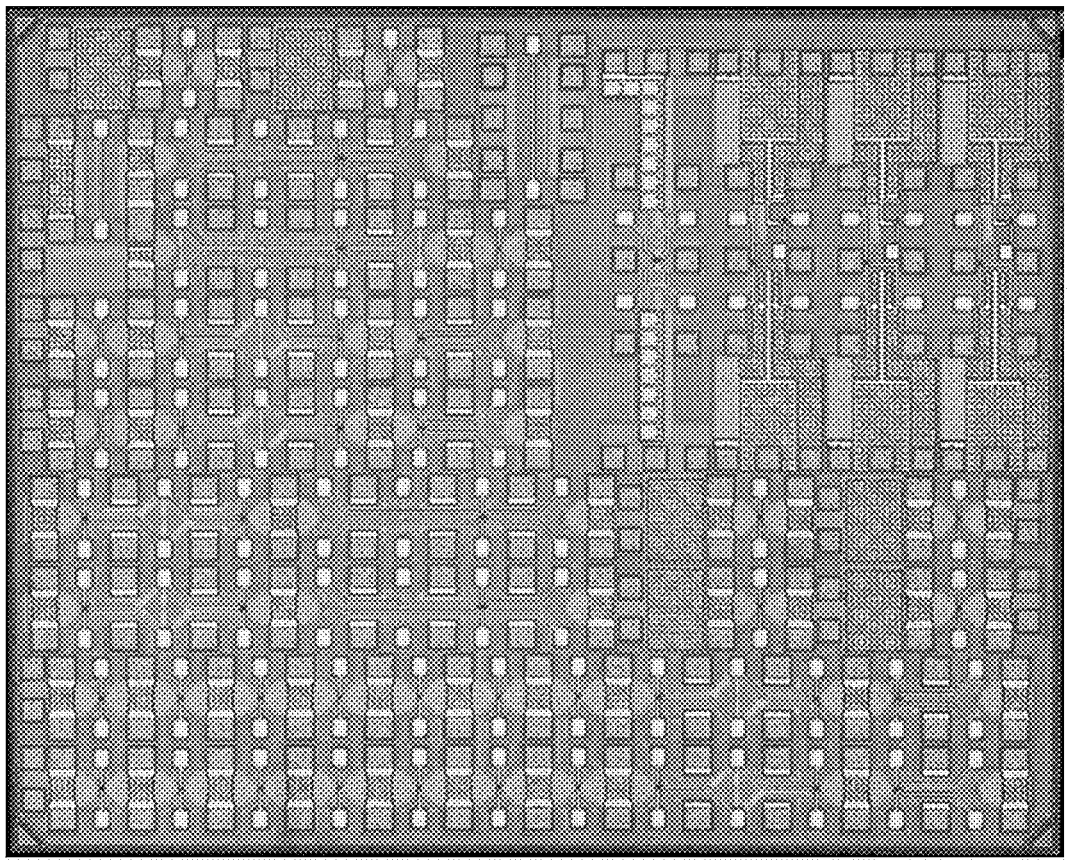
FIG. 22 shows a microphotograph of a test chip embodiment.

Design Considerations for Spin Readout Amplifiers
Cryogenic Technology Characterization According to an embodiment, a full set of MOSFETs, 4 μm by 7.5 μm MOM caps, 100Ω and 200Ω poly resistors, and the associated 6 μm×400 μm de-embedding transmission line structures are designed and fabricated in two variants of the 22 nm FDSOI CMOS process with thin metal and thick metal BEOL, respectively. FIG. 22 shows a die microphotograph of a test chip embodiment with chip dimensions of 2.5 mm by 2.0 mm, including 1×, 2×, and 3× pitch transistor test structures, passive components, quantum dot structures, and double quantum dot with readout circuits.

Figure 23:
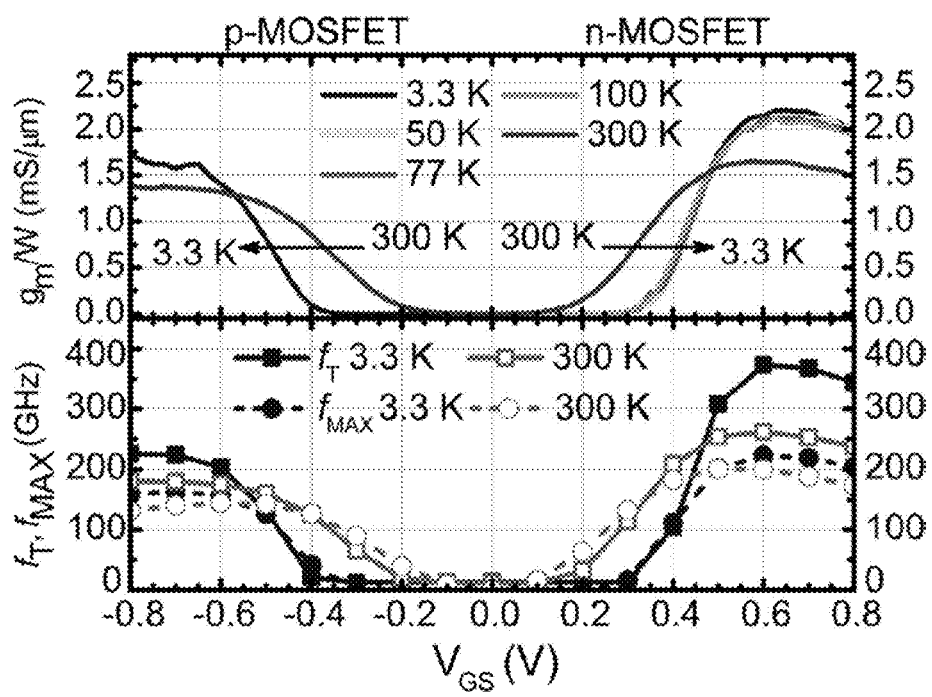
FIG. 23 shows normalized transconductance and $f_t/f_{MAX}$ against $V_{GS}$ measurements for 40×20 nm by 590 nm MOSFET embodiments.
Figure 24A:
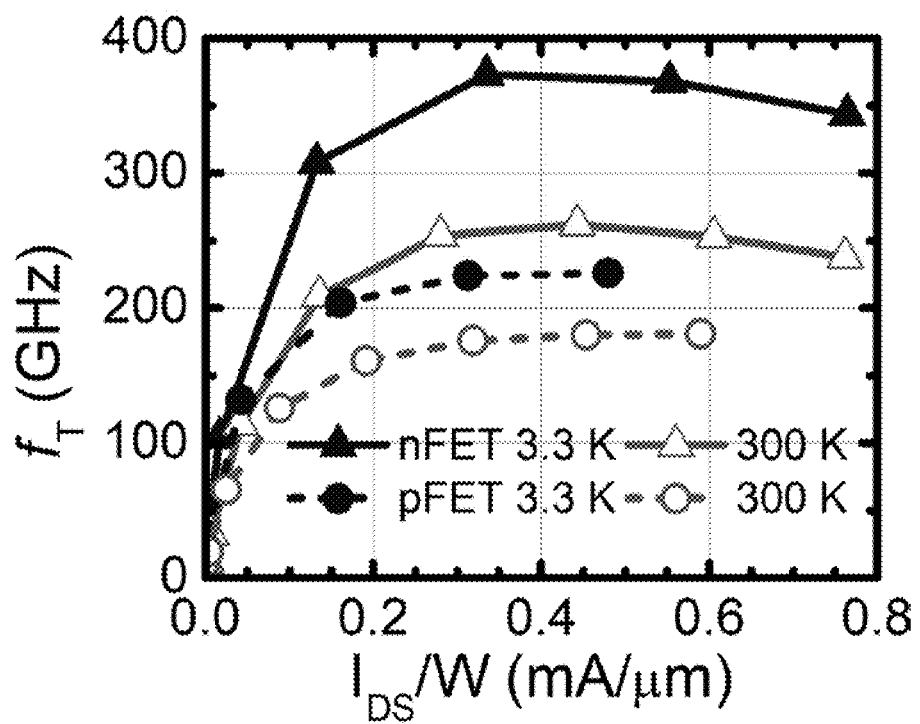
FIGS. 24(a) and 24(b) show measured $f_t$ and $f_{MAX}$ against current density for 40×20 nm by 590 nm MOSFET embodiments.
Figure 24B:
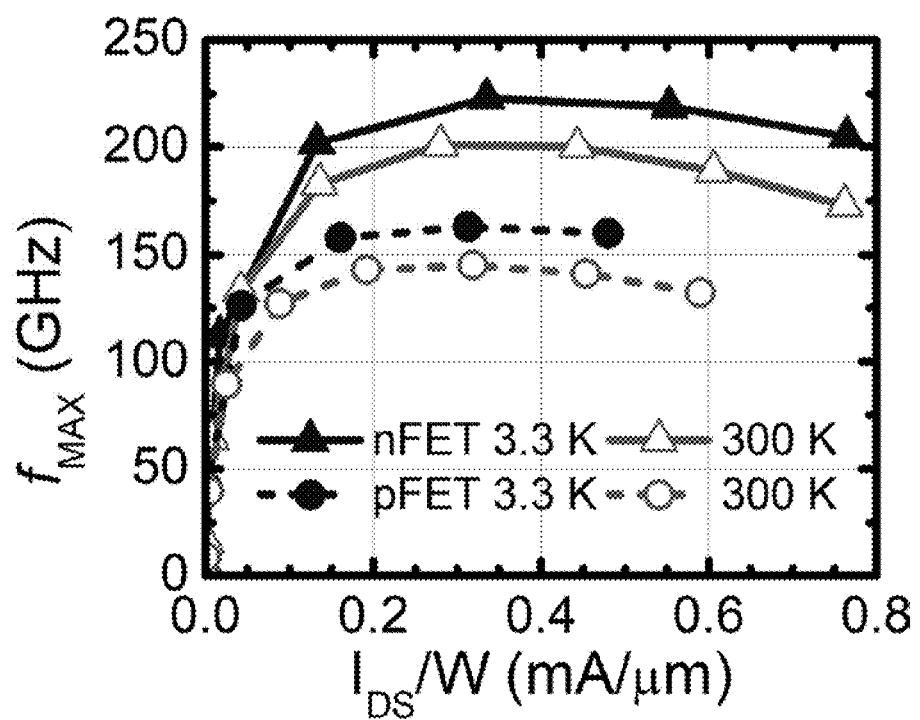
Figure 25A:
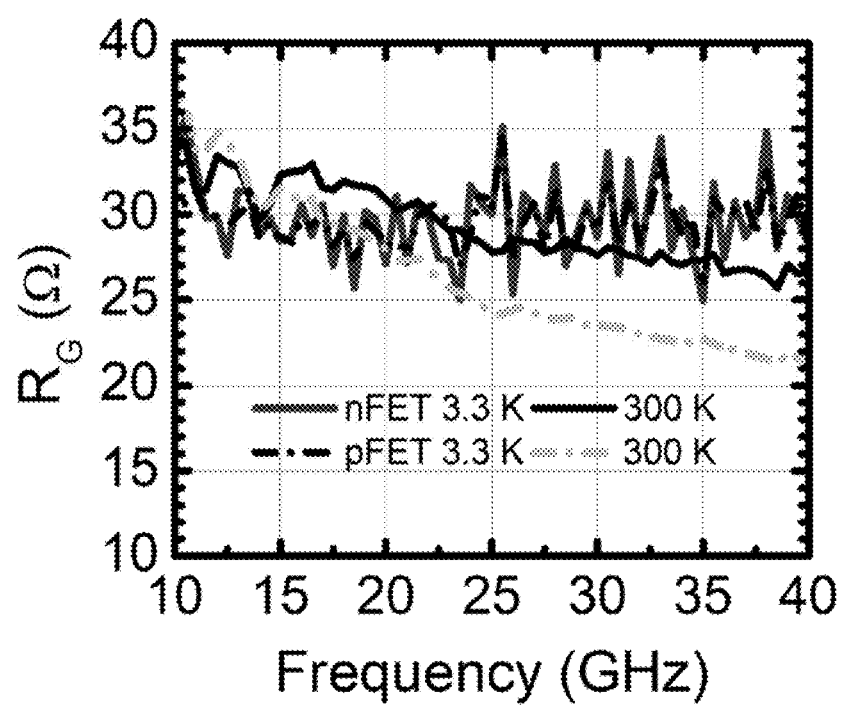
FIGS. 25(a) and 25(b) show measured $R_G$ and $R_S$ for 40×20 nm by 430 nm MOSFET embodiments.
Figure 25B:
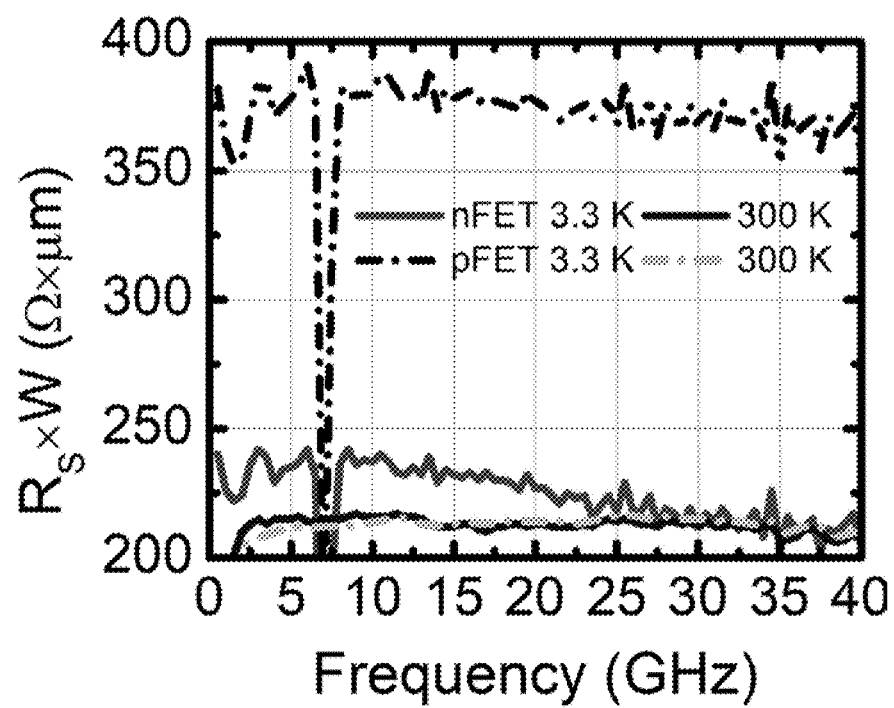
Figure 26A:
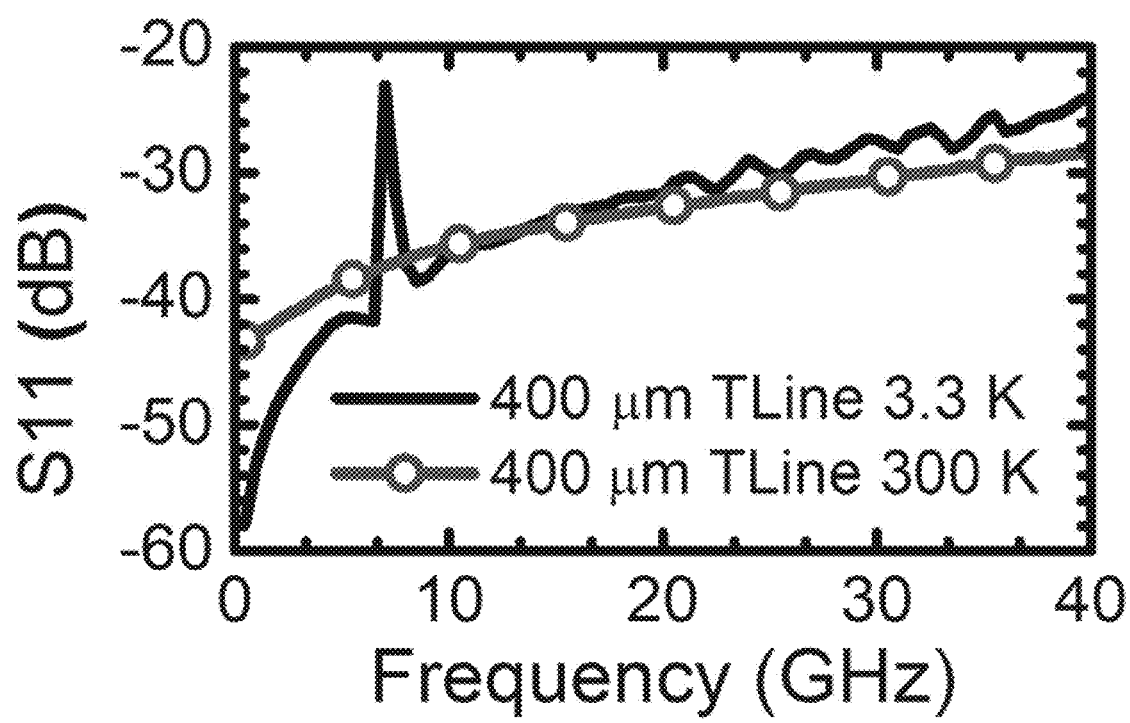
FIGS. 26(a) to 26(d) show measured passives for an embodiment's 400 μm long transmission line $S_{11}$, 400 μm long transmission line $S_{21}$, 200 fF MOM capacitor, and 100Ω and 200Ω poly resistors.
Figure 26B:
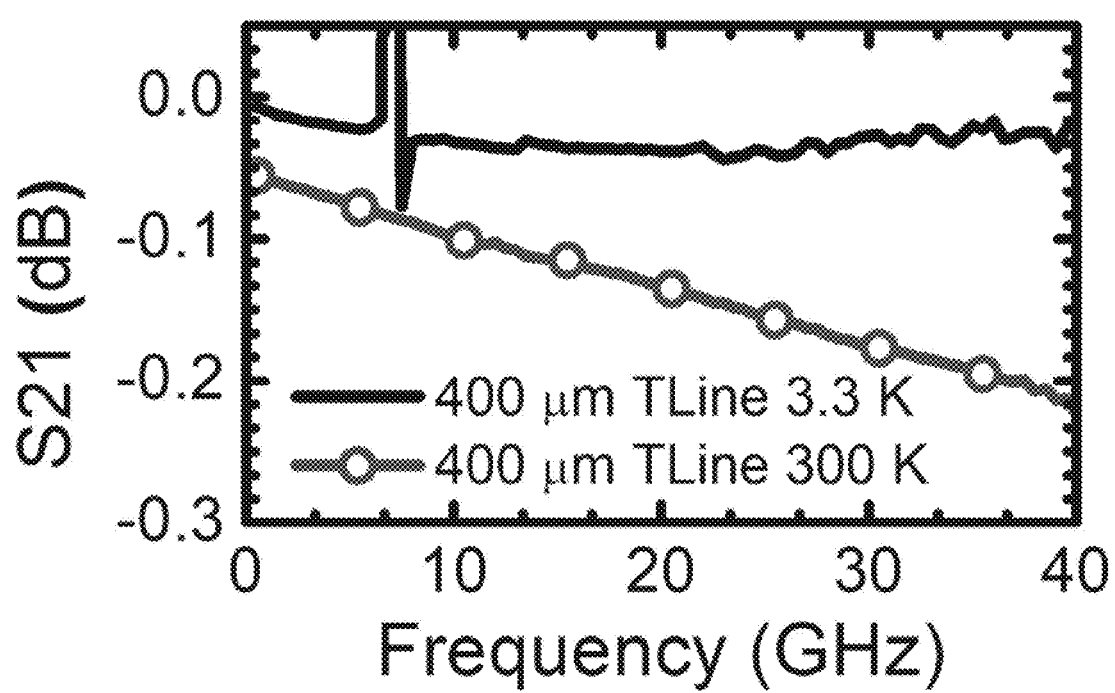
Figure 26C:
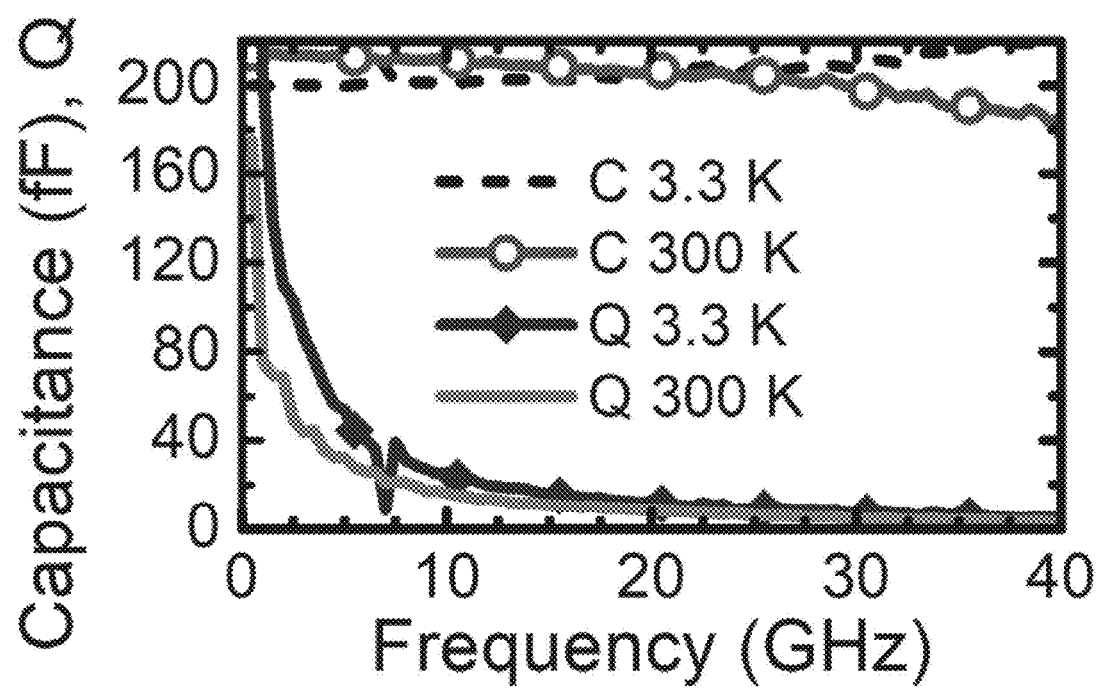
Figure 26D:
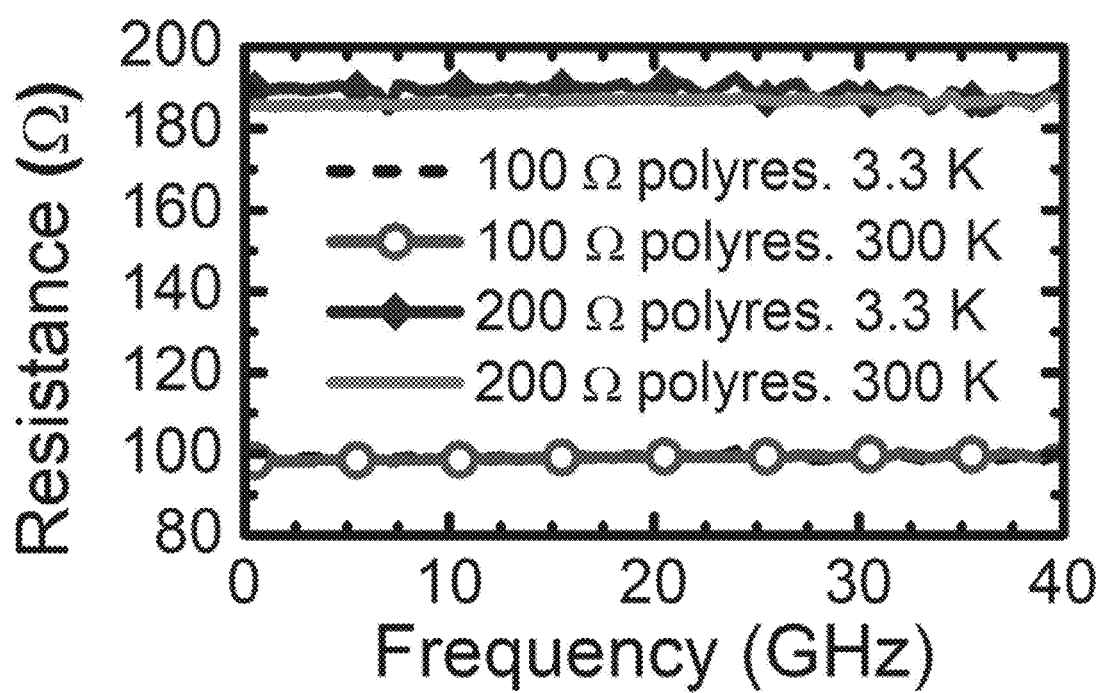

FIGS. 23 to 25 compile the measured transconductance, $f_r$, $f_{MAX}$, $R_G$, and $R_S$ for fully metallized, single-gate contact n- and p-channel MOSFET embodiments with 40 gate fingers, 20 nm gate length, 1× source/drain contact pitch, and gate finder widths of 430 m and 590 nm, at 3.3 K and 300 K. In particular, FIG. 23 shows the normalized transconductance and $f_r/f_{MAX}$ against $V_{GS}$ measurements for 40×20 nm by 590 nm MOSFET embodiments ($V_{DS}=\pm0.8$ V). FIGS. 24(a) and 24(b) show, respectively, the measured $f_r$ and $f_{MAX}$ against current density for 40×20 nm by 590 nm embodiments. FIGS. 25(a) and 25(b) show the measured $R_G$ and $R_S$, respectively, for 40×20 nm by 430 nm MOSFET embodiments.

All transistor S-parameter measurements include parasitics of the wiring stack up to the top metal, the latter being designed in an embodiment to satisfy electromigration rules up to 110° C. (383.15 K). However, at 2-4 K, electromigration is not a problem and the wiring stack can be redesigned in other embodiments for significantly reduced parasitics, resulting in better circuit performance.

Compared to 300 K, at 3.3 K the peak transconductance increased by 34% and 25% for the n- and p-MOSFET embodiments, respectively. Peak $f_r$ improves by 42% (to 373 GHz) and 25% (to 226 GHz) for n- and p-MOSFET embodiments, respectively, while peak $f_{MAX}$ improves by about 11% to 223 GHz and 163 GHz, respectively. The peak-$f_r$, peak-$f_{MAX}$ current densities remain nearly constant across temperature, simplifying the design of embodiments that must operate over a wide temperature range, even in the absence of transistor models valid at 2-4 K.

FIG. 26 shows the measured passives of the transmission line, MOM capacitor, and poly-Si resistor at 3.3 K and 300 K for an embodiment. In particular, FIGS. 26 (a), 26(b), 26(c), and 26(d) show data for an embodiment's 400 μm long transmission line $S_{11}$, 400 μm long transmission line $S_{21}$, 200 fF MOM capacitor, and 100Ω and 200Ω poly resistors. The 50Ω transmission line retains its characteristic impedance from room temperature, as evidenced by its measured $S_{11}$ in FIG. 26(a), and has lower loss at 3.3 K. The MOM capacitor Q improves at lower temperatures while the capacitance does not change. The poly-Si resistor retains the same resistance across temperature, which is useful in designing TIAs whose output impedance does not change across temperatures.

Readout Amplifier Design

According to an embodiment, fabricated qubit structures consist of minimum-size Si n-MOSFETs and SiGe p-MOSFETs and cascodes. QDs are formed in thin (<10 nm) undoped semiconductor film 1200 below each top gate 1300, which can be biased to control the confinement energies of each QD while the back gate 1400 formed in the Si substrate below the buried oxide layer 1500 controls the amount of coupling between the QDs in the cascode, which acts as a DQD. These QD structures are expected to behave as electron- and hole-spin qubits when a DC magnetic field is applied.

Figure 27:
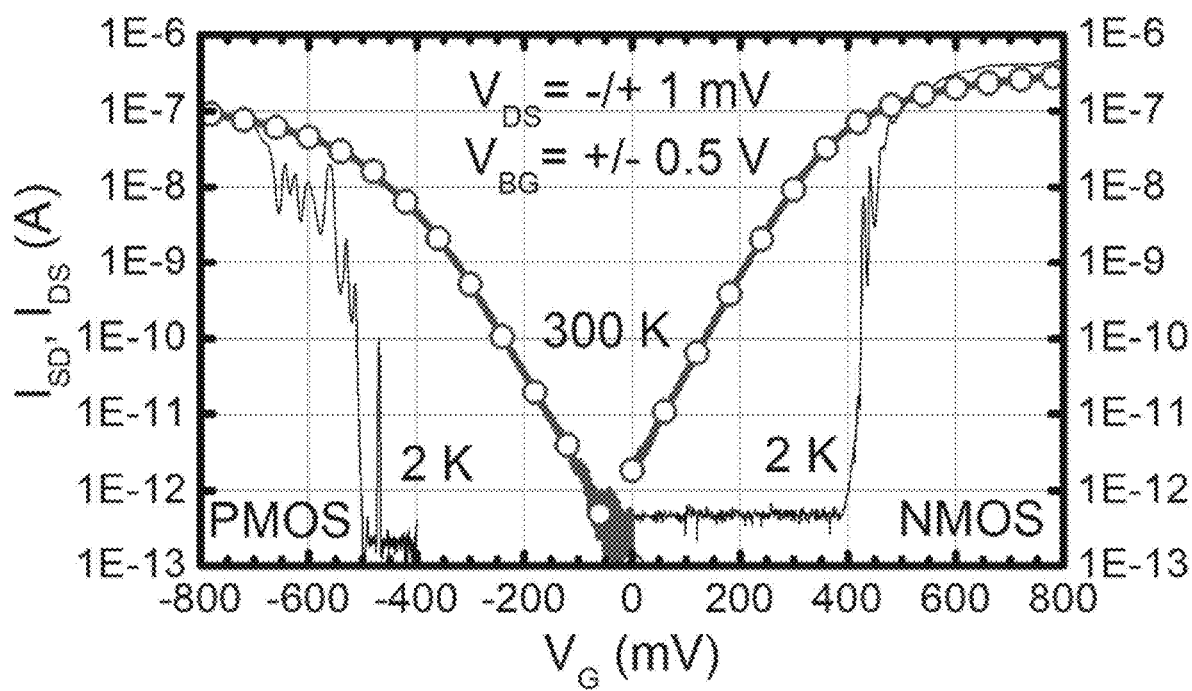
FIG. 27 shows transfer characteristics for 1×20 nm by 80 nm n-MOSFET and p-MOSFET QD embodiments.

FIG. 27 compares the measured transfer characteristics of electron- and hole-spin single quantum-dots of a 1×20 nm by 80 nm n-MOSFET and p-MOSFET QD embodiment at 2 K and 300 K. At 2 K and low $V_{DS}$ bias (<50 mV), current oscillations are observed in the sub-threshold region, representative of electron/hole tunneling events through the discrete energy levels of the QD. According to an embodiment, the TIA must detect the fast electron or hole charge transfer events and amplify the resulting small tunneling current at the first peak, on the order of 10 pA to 10 nA, to a voltage swing of at least a few mV, which can be easily processed by off-chip test equipment of FPGAs. This requires a low-noise, high-bandwidth readout amplifier with a transimpedance gain of 100-140 dBΩ, capable of driving 50Ω without significantly loading the minimum-size QDs which have less than 60 aF output capacitance.

Figure 28:
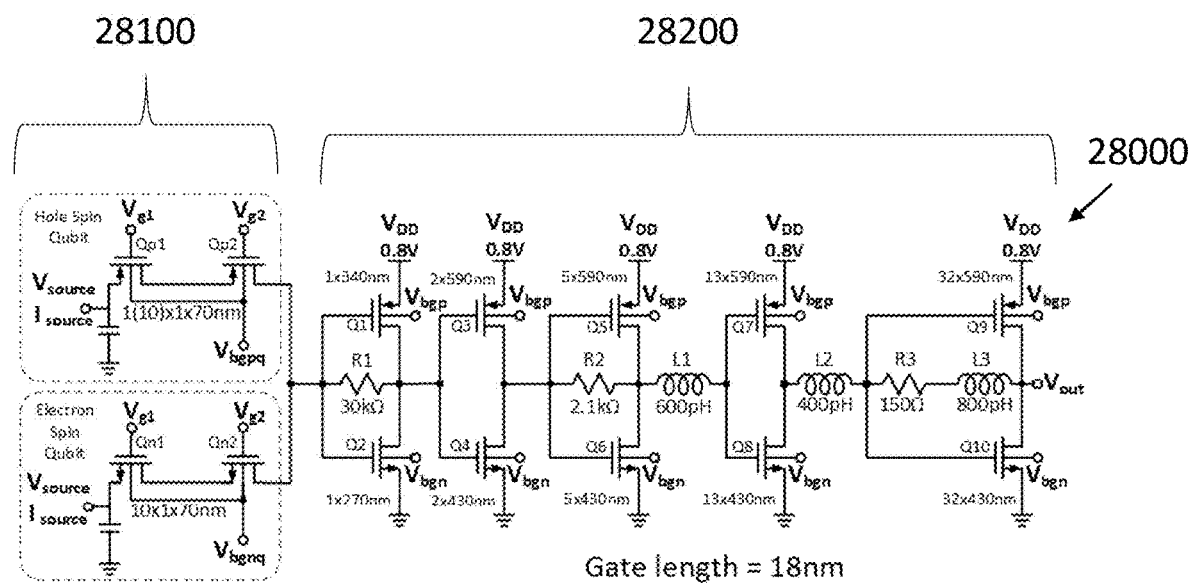
FIG. 28 shows a schematic diagram of an integrated DQD structure and readout circuit embodiment.
Figure 29:
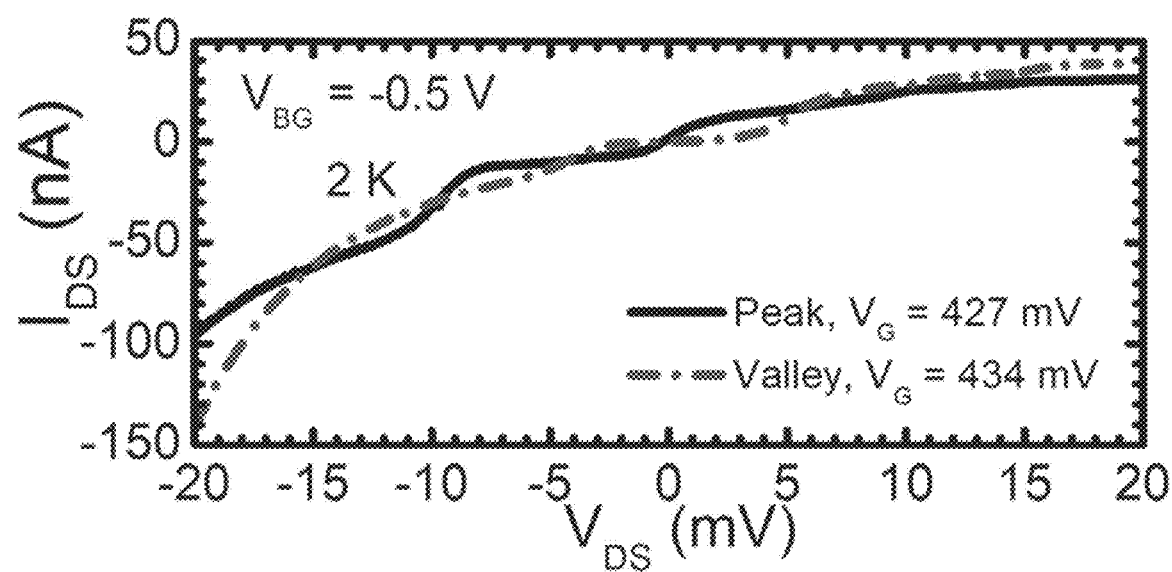
FIG. 29 shows measured output characteristics for a 1×20 nm by 80 nm n-MOSFET QD embodiment.
Figure 30:
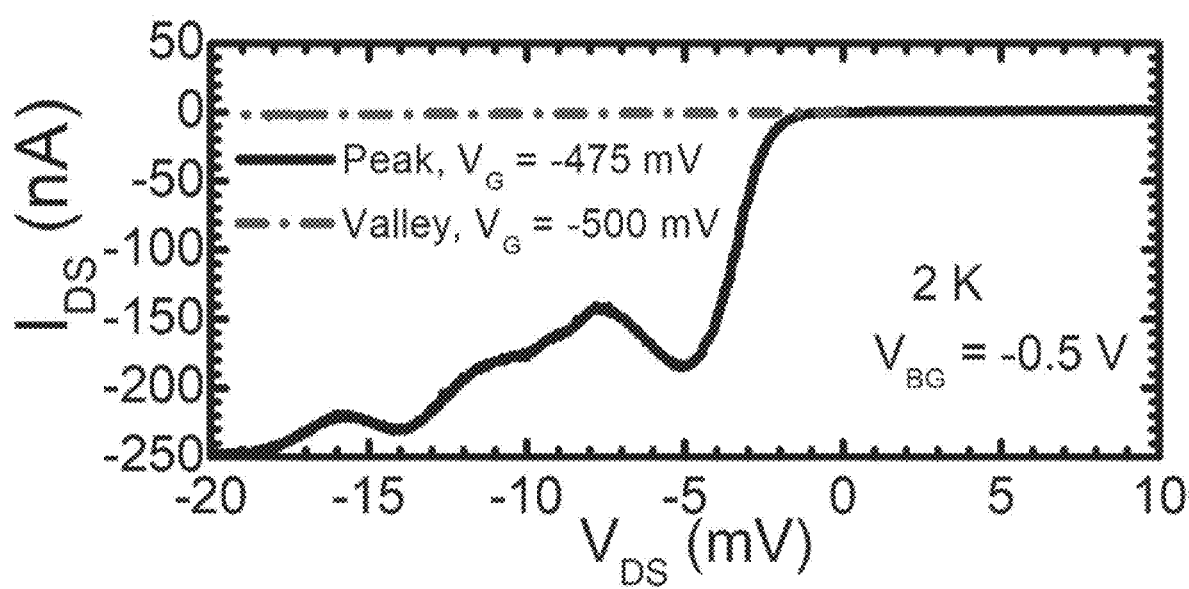
FIG. 30 shows measured output characteristics for a 1×20 nm by 80 nm p-MOSFET QD embodiment.

According to an embodiment, the circuit schematic 28000 in FIG. 28 shows an integrated DQD structure 28100 and readout circuit 28200, where the DQD is representative of a coupled-spin qubit when a DC magnetic field is applied. Both the TIA and the DQD are optimally biased, allowing qubit $V_{DS}$ control through the $V_{source}$ terminal and through the $V_{DD}$ of the TIA. FIGS. 29 and 30 show the measured output characteristics of the n- and p-MOSFET QDs when $V_{GS}$ is set at the locations of the first peak and valley, respectively, as measured at 2 K in FIG. 27.

For high fidelity, a QD with a large peak-to-valley current ratio, like the p-MOSFET embodiment in the 22 nm FDSOI process described herein, is desirable. For the n-MOSFET embodiment, because of smaller source/drain barriers in the QD, the peaks and valley are observable in the transfer characteristics (shown in FIG. 27) but reduce to plateaus in the output characteristics (shown in FIG. 29). Both of these characteristics show evidence of Coloumb blockade where electrons/holes selectively tunnel out of the QD. In the readout phase, precise $V_{DS}$ values in the 0 mV to ±5 mV range, are needed to scan for the first peak and valley in the output characteristics to ensure that the resulting drain tunneling current is from a single electron/hole.

Figure 31:
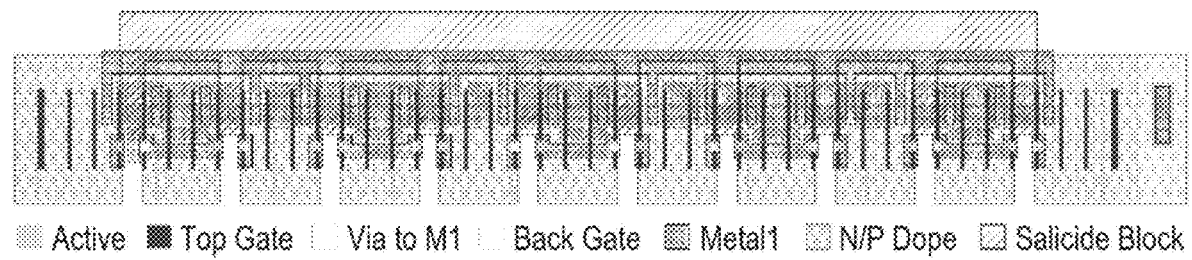
FIG. 31 shows a schematic diagram of an integrated qubit embodiment with ten cascodes connected in parallel.

In determining the behavior of both electron- and hole-spin qubits, three types of DQD embodiments are integrated with the same readout TIA (DQD-with-TIA embodiments). The first, DQD embodiment is a single finger p-MOSFET cascode (1×-DQD hole-spin qubit). The second, an embodiment with ten p-MOSFET cascodes connected in parallel (10×-DQD hole-spin qubit). The third, is a structure with ten n-MOSFET cascodes connected in parallel (10×-DQD electron spin qubit). All such QD and TIA MOSFET embodiments have a physical gate length of 18 nm, with a QD finger width of 70 nm. FIG. 31 shows the layout for the QD embodiments with 10 gate fingers connected in parallel. The readout amplifier consists of three cascaded CMOS-inverter TIA stages with CMOS inverters placed in-between to maximize gain, the interstage fanout below three to maximize bandwidth, and the MOSFETs and feedback resistor in the output stage sized for 50Ω matching.

According to an embodiment, a large 30 kΩ feedback resistor was used in the first TIA stage. According to an embodiment, the MOSFETs are biased at the peak-$f_{MAX}$ current density ($J_{pfMAX}$=0.25 mA/μm) by adjusting back gate 1400 voltages, $V_{bgn}$ and $V_{bgp}$, to reduce noise and maximize gain. The simulated transimpedance gain, bandwidth, and equivalent input noise current density at 2 GHz for the embodiment changes from 104 dBΩ, 12 GHz, 0.83 pA/√Hz to 112 dBΩ, 11 GHz, 0.19 pA/√Hz, respectively, as the temperature decreases from 300 K to 12 K, the lowest at which the circuit simulator still works.

According to an embodiment, the bandwidth of the TIA, 12 GHz, is designed to cover DC to 4× Rabi frequency when the DQD gate is excited with a mm-wave signal of up to 20 $mV_{pp}$ in the 60-220 GHz range.

Readout Amplifier Measurements

Figure 32:
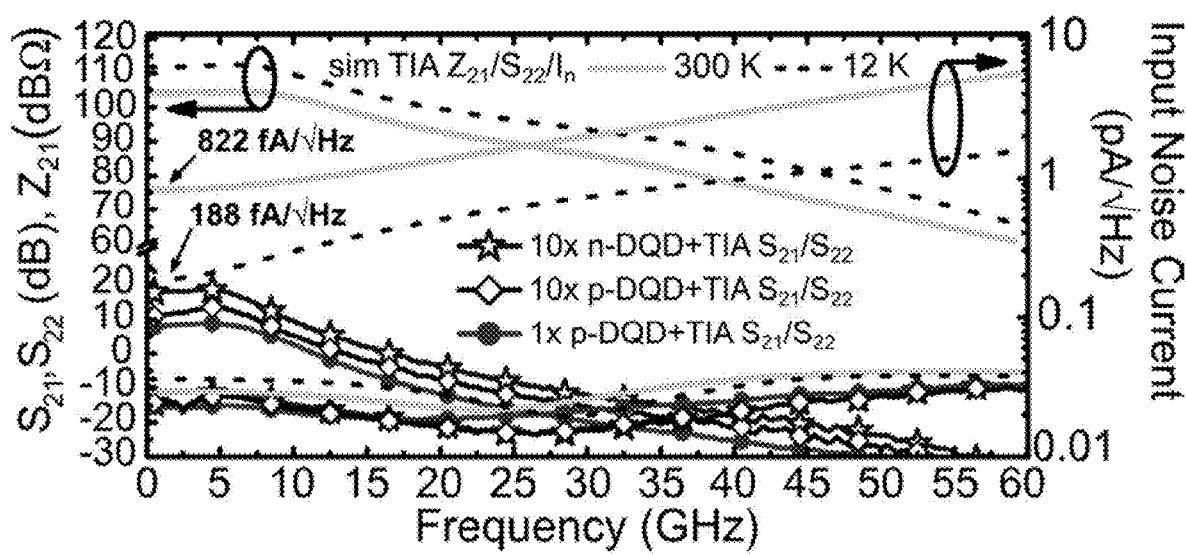
FIG. 32 shows measured S-parameters and simulated data for integrated DQD-with-TIA embodiments.

FIG. 32 shows the measured $S_{21}$ and $S_{22}$ of the three types of DQD-with-TIA embodiments at 300 K, along with simulated $Z_{21}$, $S_{22}$, and equivalent input noise current (In) of the TIA at 300 K and 12 K. Although, because of their small size and $g_m$, the standalone DQDs have an $S_{21}$ of −20 dB or less, the 10× n-MOS DQD with TIA achieved a maximum $S_{21}$ of 18.9 dB and a 3 dB bandwidth of 7.5 GHz. The equivalent 10× p-MOS DQD with TIA readout circuit has an $S_{21}$ of 13.5 dB and 7.5 GHz bandwidth, while the 1× p-MOS DQD circuit reached a maximum $S_{21}$ of 8.89 dB with a 3 dB bandwidth of 8.5 GHz. In all three embodiments, $S_{22}$ is better than −10 db up to 60 GHz. As in the transistor measurements of FIG. 24 and previous 3-stage readout TIA, the gain and bandwidth will improve at 2 K, while the output will remain matched.

Figure 33:
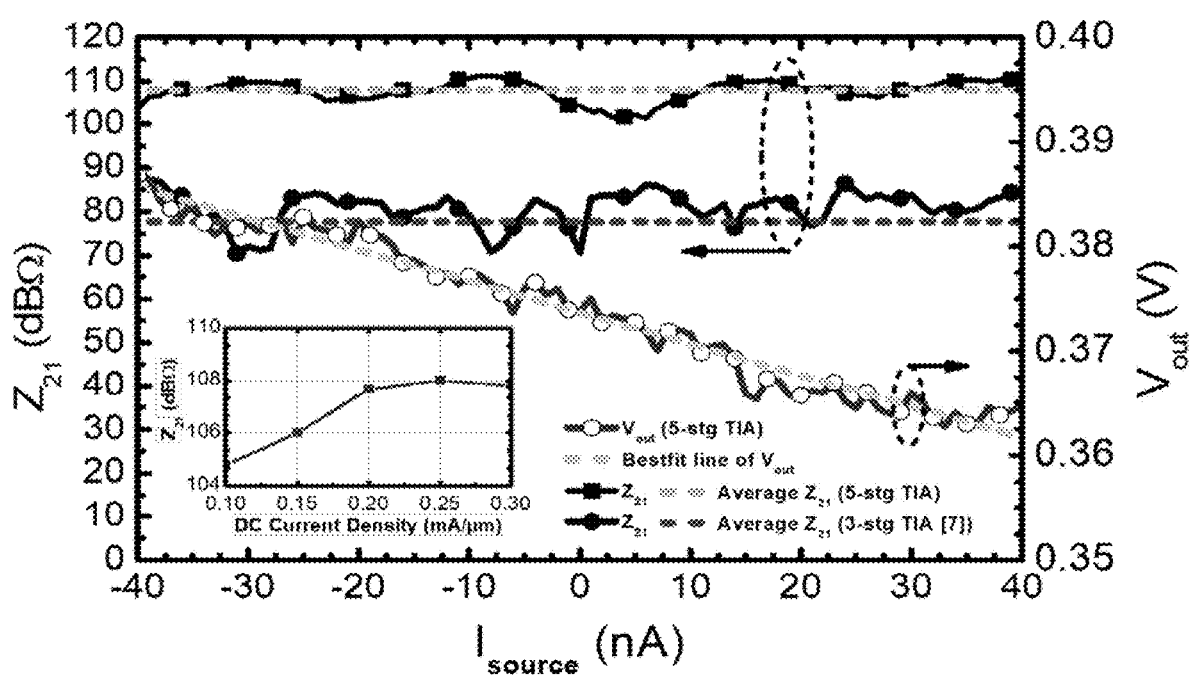
FIG. 33 shows measured $Z_{21}$ from 1× p-MOS DQD-with-amplifier embodiments.
Figure 34:
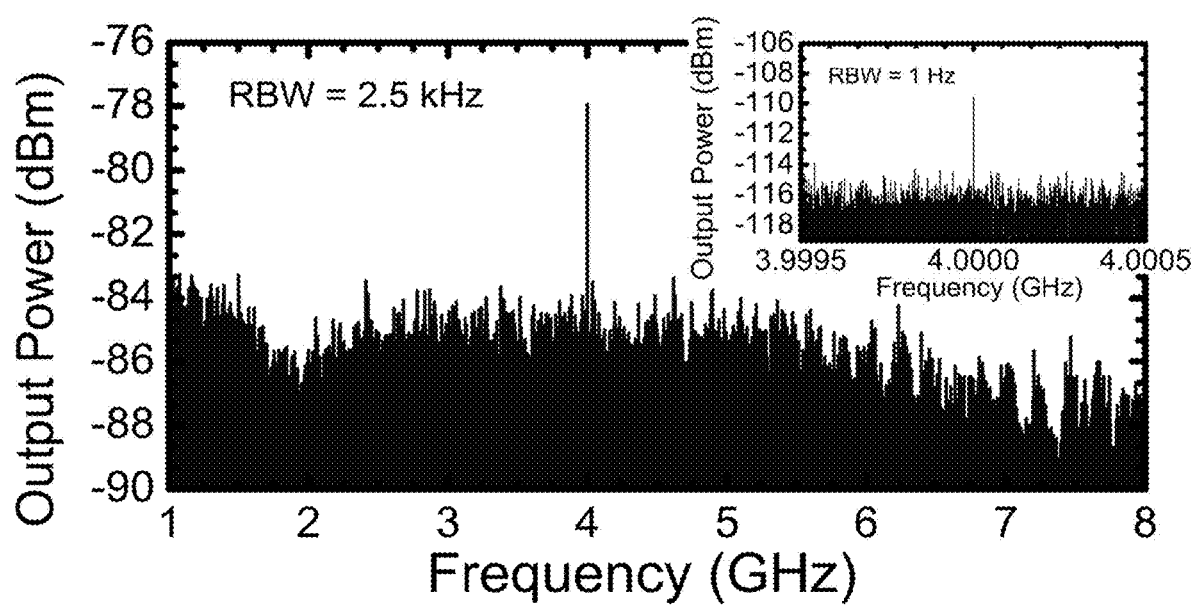
FIG. 34 shows the measured output spectrum of 1× p-DQD with TIA.

The transimpedance gain, $Z_{21}$, of the readout amplifier itself was obtained by applying a variable DC current, $I_{source}$, through the $V_{source}$ terminal and measuring the output voltage of the TIA, $V_{out}$, and its derivative, as shown in FIG. 33. The peak $Z_{21}$ is 108 dBΩ (251 kΩ) at a current density of 0.25 mA/μm, corresponding to the $J_{pfMAX}$, as illustrated in the inset of FIG. 31. The output spectrum of the 1× p-DQD-with-TIA embodiment was measured with variable-amplitude sinusoidal signals in the 1 to 8 GHz range applied to the gate of the DQD. FIG. 34 shows that even at −110 dBm output power, the 4 GHz sinusoidal signal is visible above the noise floor. Based on the 251 kΩ TIA gain, this corresponds to 3 $pA_{rms}$ current at the input of the TIA. FIG. 35 shows a comparison of the performance of the DQD-with-TIA embodiments to other state-of-the-art qubit readout amplifiers intended to operate at cryogenic temperatures.

Figure 37A:
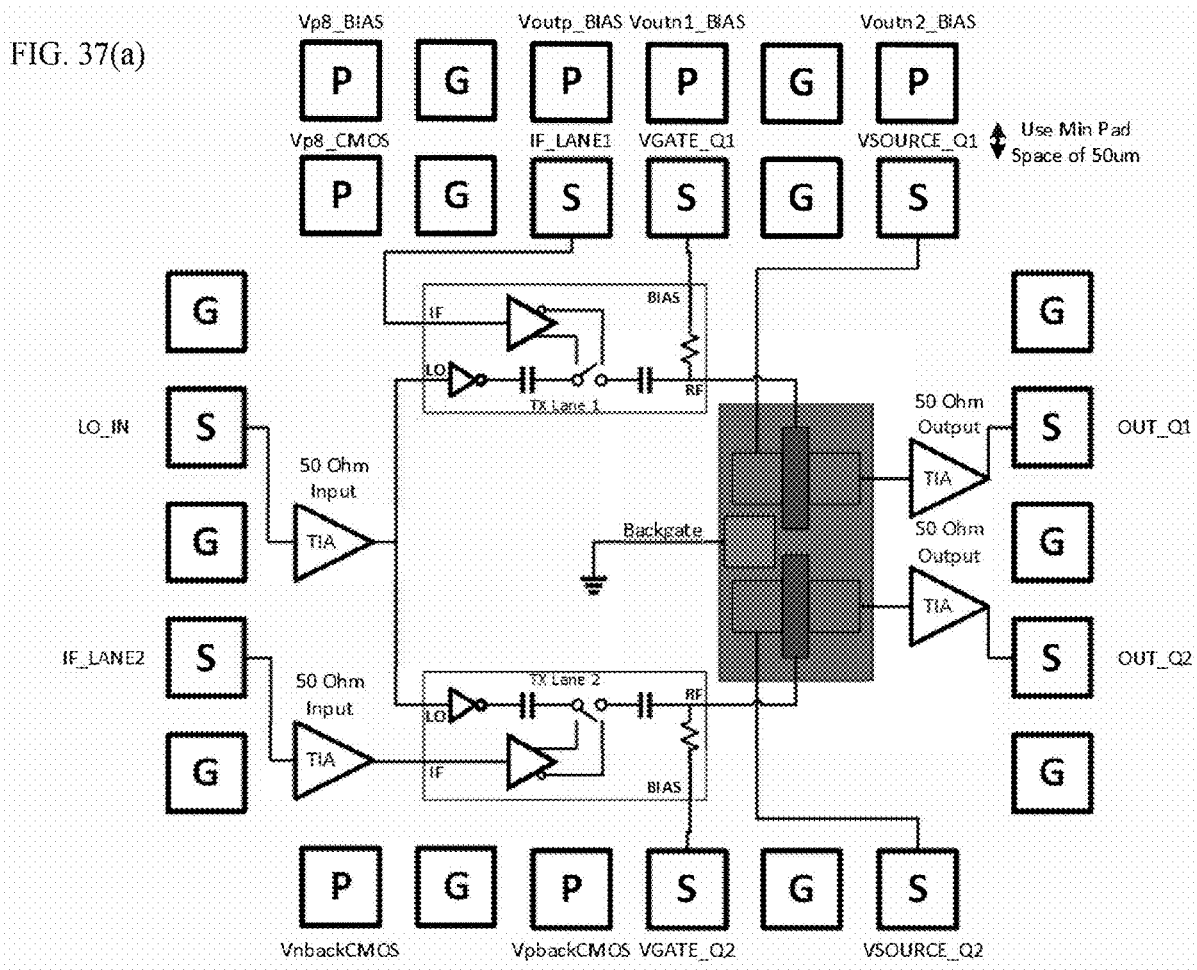
FIGS. 37(a) and 37(b) show two embodiments of a two-qubit quantum processor with spin manipulation and readout circuits.
Figure 37B:
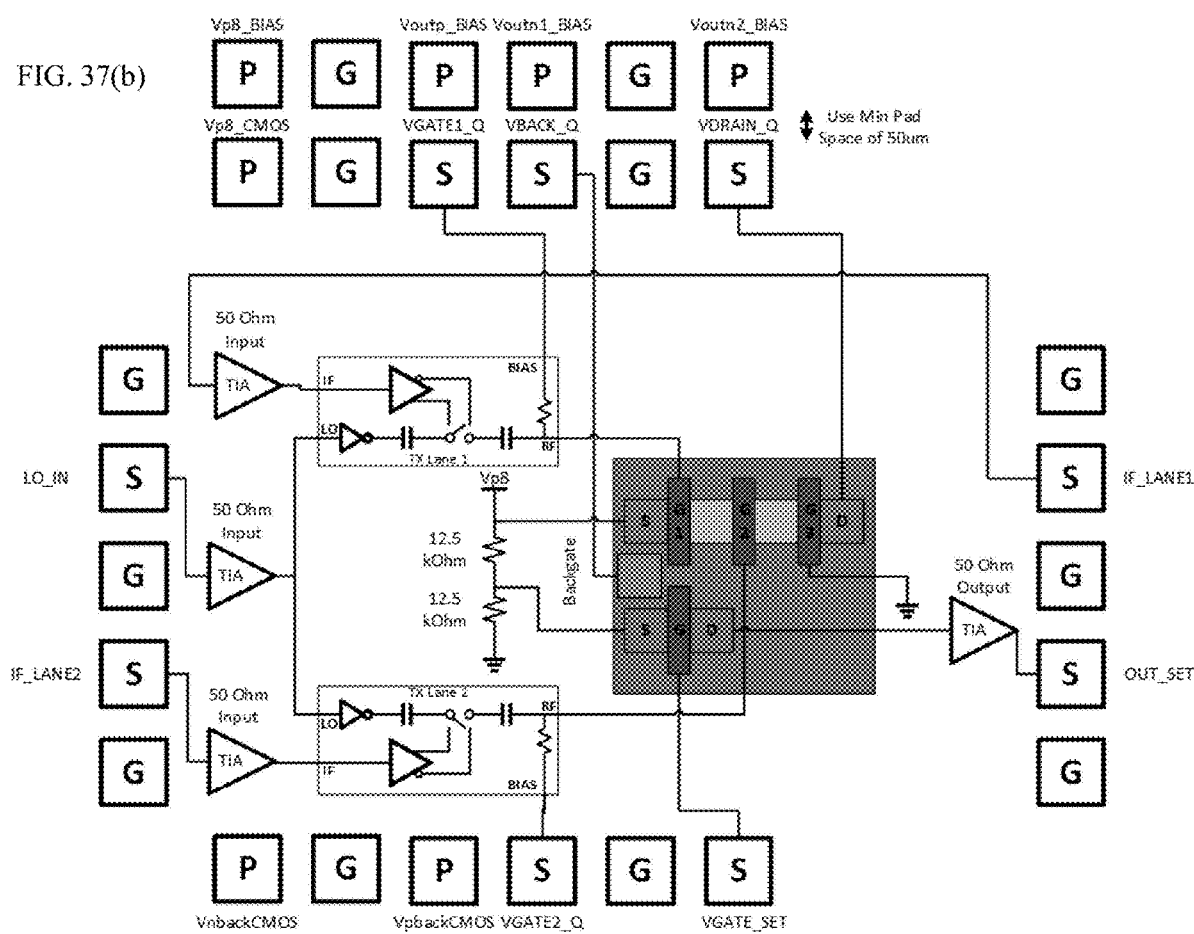

FIGS. 37(a) and 37(b) show two spin manipulation and readout circuit embodiments. FIG. 37(a) shows monolithically integrated spin manipulation and readout circuit for two capacitively-coupled single-spin qubits. Spin manipulation circuit consists of input amplifier with 50 Ohm input matching and a bandwidth sufficiently high to encompass the spin excitation frequency in the 60-160 GHz range. Excitation frequency signal is on-off modulated before being applied to the gate of the qubits. On-off pulse widths as short as 20 ps are needed to accommodate pi/2 spin rotations with a Rabi frequency as high as 12.5 GHz. Readout amplifiers are connected to the drains of the qubits and can drive 50 Ohm.

FIG. 37(b) shows a monolithically integrated spin manipulation and readout circuit for a group of a double quantum dot qubit capacitively-coupled to a single-spin qubit. The third gate in the double quantum dot structure (G3) is intended to act as a taller confining barrier for the dot under gate 2. Spin manipulation and readout circuits are identical to those described for FIG. 37(a).

Figure 38:
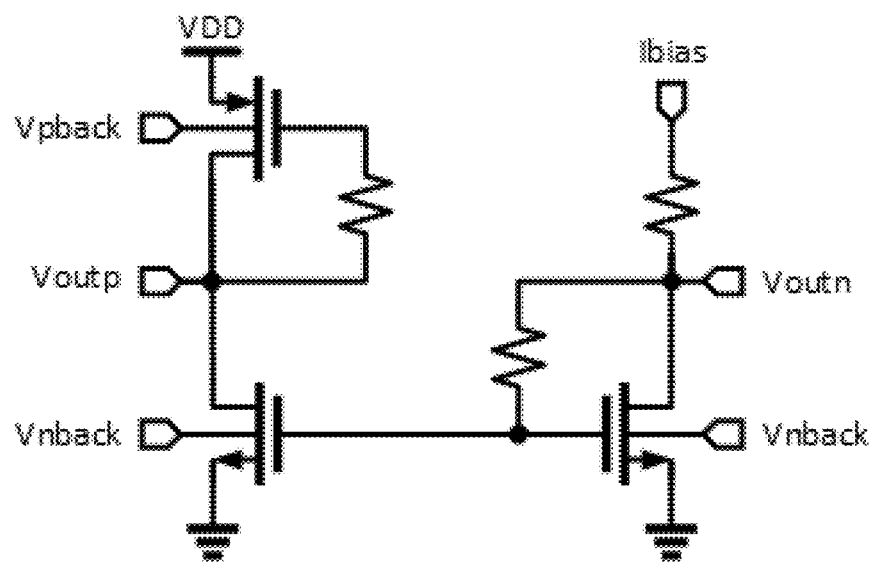
FIG. 38 shows a schematic of a back gate biasing circuit to ensure constant current density biasing at all temperatures.

FIG. 38 shows a schematic of a back gate biasing circuit according to an embodiment. It enables the CMOS amplifiers and logic to be appropriately biased for the fastest and/or lowest noise performance over temperature and process. The desired current density bias is set through ibias in the right branch and the NMOS back gate voltage (vnback) is adjusted until voutn is half of the supply voltage (0.4V since in this case supply is 0.8V). Next, the PMOS back gate is adjusted until voutp is also half of the supply voltage. The back gate voltages can now be used to bias all other CMOS amplifiers and logic in the monolithically integrated quantum processor.

Various embodiments of the invention have been described in detail. Since changes in and or additions to the above-described best mode may be made without departing from the nature, spirit or scope of the invention, the invention is not to be limited to those details but only by the appended claims. Section headings herein are provided as organizational cues. These headings shall not limit or characterize the invention set out in the appended claims.

What is claimed is:

1. A back gate biasing circuit for providing constant current density biasing, the back gate biasing circuit comprising:
   a circuit branch configured to set a current density bias;
   at least one N-channel metal-oxide semiconductor (NMOS) back gate having a NMOS back voltage (vnback) adjusted to set a NMOS output voltage voutn voltage that is approximately half of a supply voltage; and
   at least one P-channel metal-oxide semiconductor (PMOS) back gate having a PMOS back voltage (vpback) adjusted to set a PMOS output voltage voutp voltage that is approximately half of the supply voltage,
   wherein at least one of the NMOS back gate or the PMOS back gate are configured to bias at least one complementary metal-oxide semiconductor amplifier.

2. The back gate biasing circuit of claim 1, wherein the back gate biasing circuit provides constant current biasing at different temperatures.

3. The use of the back gate biasing circuit of claim 1 with complementary metal-oxide semiconductor amplifiers.

4. The use of the back gate biasing circuit of claim 1 in a monolithically integrated quantum processor.

5. A method of setting a desired current density bias in a back gate biasing circuit according to the back gate biasing circuit of claim 1, comprising the steps of
   setting the current density bias to a desired current density bias;
   adjusting the N-channel metal-oxide semiconductor (NMOS) back gate voltage until the NMOS output voltage (voutn) is approximately half of the supply voltage; and
   adjusting the P-channel metal-oxide semiconductor (PMOS) back gate voltage until the PMOS output voltage (voutp) is approximately half of the supply voltage.

6. The method of claim 5, wherein the supply voltage is approximately 0.8V.

7. The back gate biasing circuit of claim 1, further comprising a second NMOS back gate of the at least one NMOS back gate, the second NMOS back gate having a NMOS back voltage (vnback) configured to set a NMOS output voltage.

* * * * *